US012648309B2

(12) United States Patent
Cha et al.

(10) Patent No.: US 12,648,309 B2
(45) Date of Patent: Jun. 2, 2026

(54) DISPLAY DEVICE AND METHOD OF PROVIDING THE SAME

(71) Applicant: Samsung Display Co., LTD., Yongin-si (KR)

(72) Inventors: Gwangmin Cha, Yongin-si (KR); Jungi Kim, Yongin-si (KR); Hye Sun Kim, Yongin-si (KR); Sanghyun Yun, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 424 days.

(21) Appl. No.: 18/470,506

(22) Filed: Sep. 20, 2023

(65) Prior Publication Data

US 2024/0107816 A1     Mar. 28, 2024

(30) Foreign Application Priority Data

Sep. 22, 2022    (KR) ........................ 10-2022-0120284

(51) Int. Cl.
| | |
|---|---|
| *H10K 59/122* | (2023.01) |
| *H10K 59/12* | (2023.01) |
| *H10K 59/131* | (2023.01) |
| *H10K 71/13* | (2023.01) |
| *H10K 71/20* | (2023.01) |

(52) U.S. Cl.
CPC ....... *H10K 59/122* (2023.02); *H10K 59/1201* (2023.02); *H10K 59/131* (2023.02); *H10K 71/135* (2023.02); *H10K 71/233* (2023.02)

(58) Field of Classification Search
CPC ............. H10K 59/122; H10K 59/1201; H10K 59/131; H10K 71/135; H10K 71/233; H10K 59/8723; H10K 59/80522; H10K 50/8428; H10K 50/11; H10K 50/81
See application file for complete search history.

(56) References Cited

U.S. PATENT DOCUMENTS

| | | | |
|---|---|---|---|
| 9,786,694 | B2 | 10/2017 | Cha et al. |
| 2014/0291623 | A1 | 10/2014 | Choi |

FOREIGN PATENT DOCUMENTS

| | | |
|---|---|---|
| KR | 20140120427 A | 10/2014 |
| KR | 20150092792 A | 8/2015 |
| KR | 1020170019555 A | 2/2017 |
| KR | 20180076496 A | 7/2018 |
| KR | 10-2113179 B1 | 5/2020 |

OTHER PUBLICATIONS

Lopez-Carreno et al., "Different oxidation states of polycrystalline molybdenum treated by O2-plasma or 02-ion bombardment", Surface Science 1998, 402-404, 74-177.
Korean Office Action for Korean Patent Application 10-2022-0120284 dated Feb. 27, 2026 with translation.

*Primary Examiner* — Elmito Breval
(74) *Attorney, Agent, or Firm* — CANTOR COLBURN LLP

(57) ABSTRACT

A display device includes a pixel electrode of a light emitting element, a pixel defining layer on the pixel electrode and in which an opening is defined, the opening exposing the pixel electrode to outside the pixel defining layer, a light emitting layer of the light emitting element which is in the opening and on the pixel electrode, a metal pattern which is on the pixel defining layer and spaced apart from the pixel electrode in a direction along the pixel defining layer, and a spacer which is on the metal pattern, the spacer being spaced apart from the pixel defining layer along a thickness direction of the display device, by the metal pattern.

20 Claims, 26 Drawing Sheets

F I G .  4
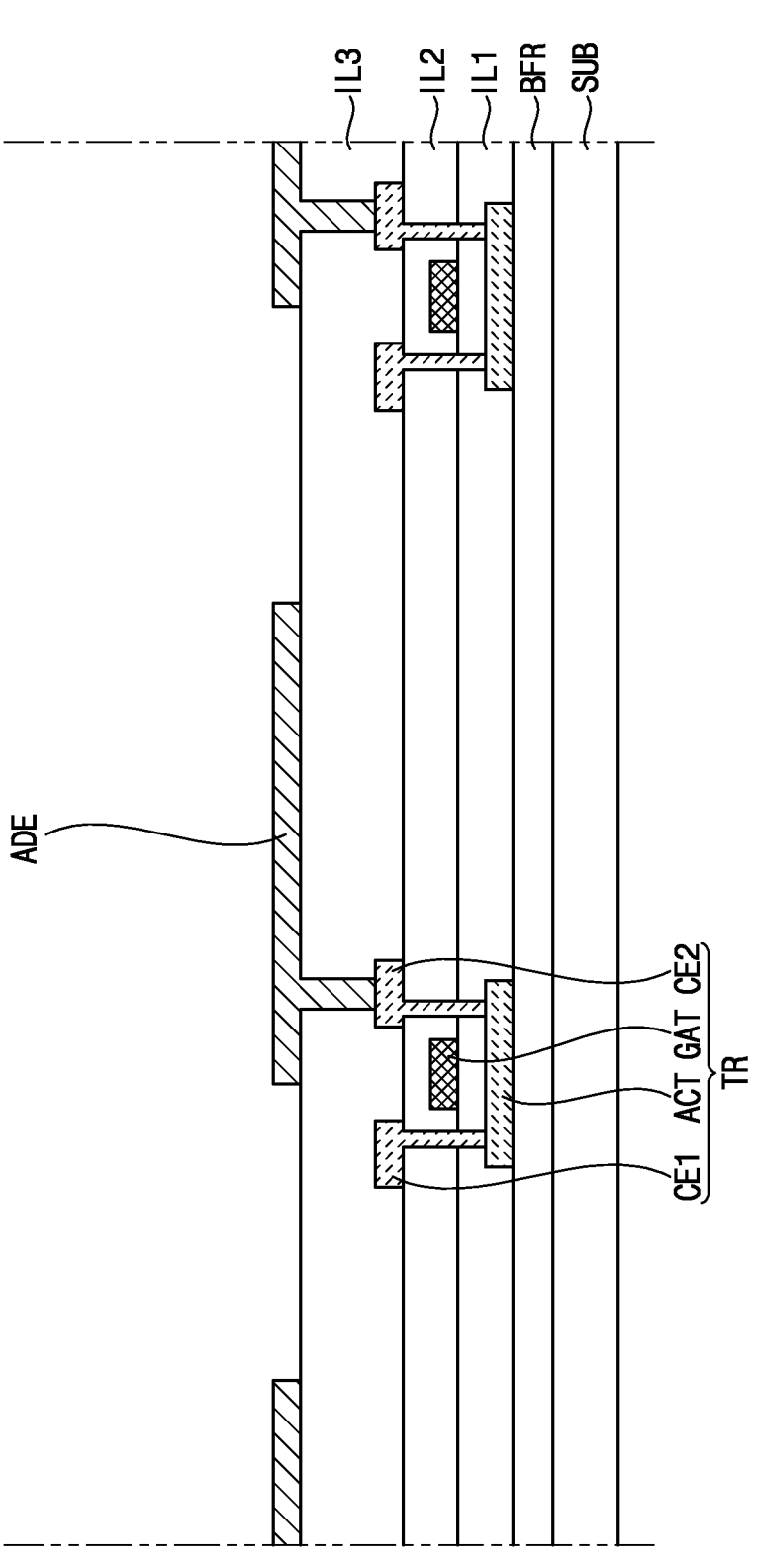

DISPLAY DEVICE AND METHOD OF PROVIDING THE SAME

This application claims priority to Korean Patent Application No. 10-2022-0120284, filed on Sep. 22, 2022, and all the benefits accruing therefrom under 35 U.S.C. § 119, the content of which in its entirety is herein incorporated by reference.

BACKGROUND

1. Field

Embodiments of the invention relate to a display device and method of manufacturing (or providing) the display device.

2. Description of the Related Art

The display device includes sub-pixels that implement red, green, and blue visible light. A light emitting layer and a functional layer may be formed or provided in each of the sub-pixels. The light emitting layer and the functional layer may be formed or provided using an inkjet printing method.

SUMMARY

Embodiments provide a display device with improved reliability of a stacked structure.

Embodiments provide a method for manufacturing (or providing) the display device with improved reliability of a stacked structure.

A display device according to an embodiment includes a substrate, a pixel electrode disposed on the substrate, a pixel defining layer defining an opening exposing a portion of the pixel electrode, a light emitting layer overlapping the opening and disposed on the pixel electrode, a metal layer disposed on the pixel defining layer and spaced apart from the pixel electrode, and a spacer overlapping the pixel defining layer on a plane, disposed on the metal layer, and spaced apart from an upper surface of the pixel defining layer by the metal layer.

In an embodiment, the display device includes a pixel electrode of a light emitting element, a pixel defining layer on the pixel electrode and in which an opening is defined, the opening exposing the pixel electrode to outside the pixel defining layer, a light emitting layer of the light emitting element which is in the opening and on the pixel electrode, a metal pattern which is on the pixel defining layer and spaced apart from the pixel electrode in a direction along the pixel defining layer, and a spacer which is on the metal pattern, the spacer being spaced apart from the pixel defining layer along a thickness direction of the display device, by the metal pattern.

In an embodiment, the metal layer may include a metal material soluble in water when oxidized. That is, the metal layer may include a metal material which is oxidizable to define an oxidized portion soluble in water.

In an embodiment, the metal layer may include molybdenum.

In an embodiment, the spacer may include oxygen atoms, and a content of the oxygen atoms included in the spacer may be partially non-uniform. That is, the spacer may include a content of oxygen atoms which is non-uniform along the thickness direction of the display device.

In an embodiment, a content of oxygen atoms in an area adjacent to an upper surface of the spacer may be greater than a content of oxygen atoms in an area adjacent to a lower surface of the spacer. That is, the spacer may include along the thickness direction, an upper surface furthest from the pixel defining layer, and a lower surface closest to the pixel defining layer, and the content of oxygen atoms adjacent to the upper surface greater than the content of oxygen atoms adjacent to the lower surface.

In an embodiment, the upper surface of the pixel defining layer may have liquid repellency. That is, the pixel defining layer may include includes along the thickness direction, an upper surface which is closest to the spacer and has liquid repellency.

In an embodiment, the metal layer may be disposed on the upper surface of the pixel defining layer, and an upper surface of the metal layer may be entirely covered by the spacer.

In an embodiment, the metal layer may be disposed on the upper surface of the pixel defining layer, and a portion of an upper surface of the metal layer may be exposed from the spacer. That is, the metal layer may extend further than the spacer in the direction along the pixel defining layer and define a portion of the metal layer which is exposed outside of the spacer.

In an embodiment, the metal layer may be also disposed on a portion of a side surface of the pixel defining layer.

In an embodiment, the side surface of the pixel defining layer may include a first surface overlapping the metal layer and a second surface extending from an edge of the metal layer to the pixel electrode and spaced apart from the metal layer.

A method of manufacturing a display device according to an embodiment includes forming a pixel electrode on a substrate, forming a pixel defining layer defining an opening exposing a portion of the pixel electrode, forming a preliminary metal layer covering the pixel electrode and the pixel defining layer, forming a spacer overlapping the pixel defining layer on a plane, disposed on the preliminary metal layer, and exposing a portion of the preliminary metal layer, oxidizing the portion of the preliminary metal layer exposed from the spacer, forming a metal layer disposed on the pixel defining layer and spaced apart from the pixel electrode by removing an oxidized portion of the preliminary metal layer; and forming a light emitting layer on the pixel electrode.

In an embodiment, the oxidized portion of the preliminary metal layer may be removed by dissolving with distilled water.

In an embodiment, the portion of the preliminary metal layer exposed from the spacer may be oxidized by plasma treatment using oxygen (O2) gas.

In an embodiment, after the portion of the preliminary metal layer exposed from the spacer is oxidized, a content of oxygen atoms included in the spacer may be partially non-uniform.

In an embodiment, after the portion of the preliminary metal layer exposed from the spacer is oxidized, a content of oxygen atoms in an area adjacent to an upper surface of the spacer may be greater than a content of oxygen atoms in an area adjacent to a lower surface of the spacer.

In an embodiment, the light emitting layer may be formed using an inkjet printing method.

In an embodiment, forming the spacer may include forming a spacer composition layer on the preliminary metal layer and forming the spacer by patterning the spacer composition layer through an exposure process using a mask.

In an embodiment, the metal layer may be formed to be disposed on an upper surface of the pixel defining layer, and an upper surface of the metal layer may be entirely covered by the spacer.

In an embodiment, the method may further include removing a portion of the spacer after oxidizing the portion of the preliminary metal layer exposed from the spacer, the spacer may include a first portion having a first thickness, and a second portion having a second thickness smaller than the first thickness, and the second portion of the spacer having the second thickness may be removed by removing the portion of the spacer.

In an embodiment, the metal layer may be disposed on an upper surface of the pixel defining layer and on a side surface of the pixel defining layer, and a portion of an upper surface of the metal layer is exposed from the spacer.

Therefore, the display device according to embodiments may include a metal layer disposed between a pixel defining layer and a spacer, and the spacer may be spaced apart from an upper surface of the pixel defining layer by the metal layer. In other words, the spacer may not contact the upper surface of the pixel defining layer by the metal layer. Accordingly, surface characteristics of the pixel defining layer may not affect the spacer. Accordingly, reliability of the stacked structure of the display device may be improved.

Also, according to a manufacturing method of the display device (or method providing thereof) according to the embodiments, a preliminary metal layer may be formed (or provided) on the pixel defining layer, and a spacer composition layer for forming the spacer may be formed on the preliminary metal layer. Accordingly, the spacer composition layer may not contact the upper surface of the pixel defining layer. Accordingly, when forming the spacer composition layer, surface characteristics of the pixel defining layer may not be affected. Accordingly, the spacer composition layer may be uniformly formed on the preliminary metal layer. Accordingly, occurrence of defects in a process of forming the spacer may be minimized or prevented. Accordingly, reliability of the stacked structure of the display device may be improved.

It is to be understood that both the foregoing general description and the following detailed description are exemplary and explanatory and are intended to provide further explanation of the invention as claimed.

BRIEF DESCRIPTION OF THE DRAWINGS

Illustrative, non-limiting embodiments will be more clearly understood from the following detailed description taken in conjunction with the accompanying drawings.

FIGS. 4 to 15 are cross-sectional views illustrating a method of manufacturing the display device of FIG. 1.

FIG. 16 is a cross-sectional view illustrating a display device according to another embodiment.

FIGS. 17 to 26 are cross-sectional views illustrating a manufacturing method of the display device of FIG. 16.

DETAILED DESCRIPTION

Figure 1:
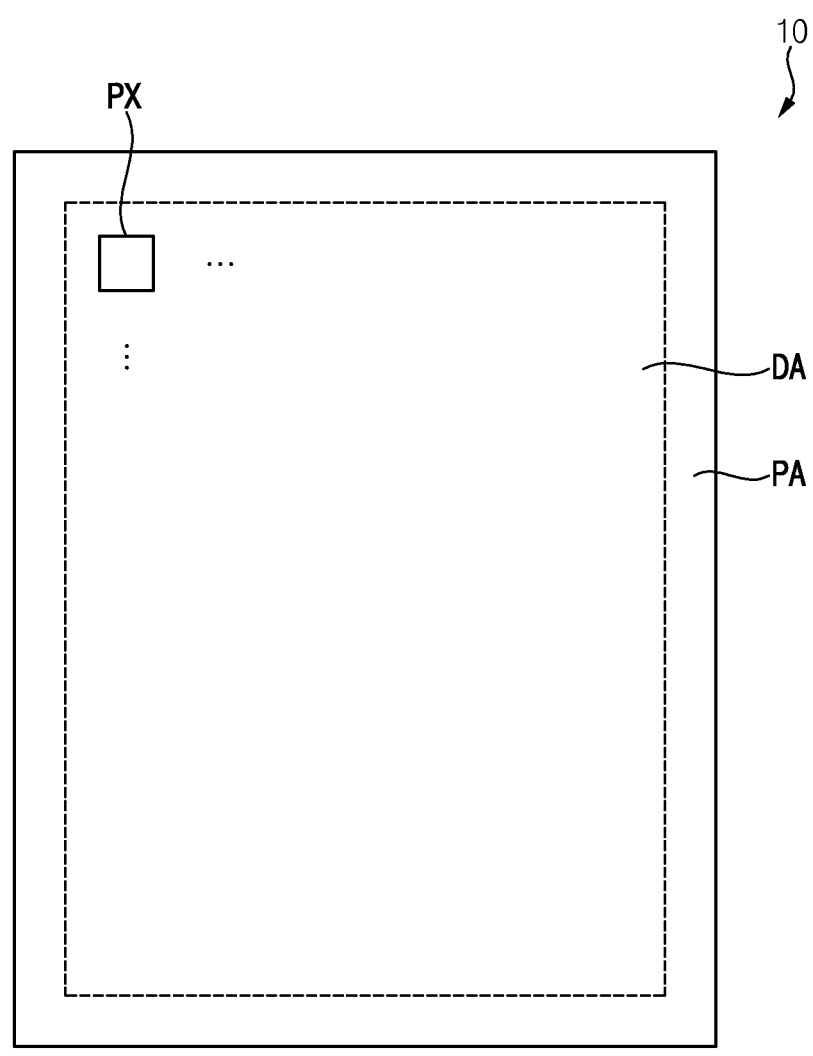
FIG. 1 is a plan view illustrating a display device according to an embodiment.
Figure 1:
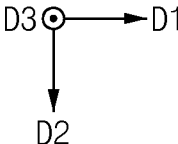

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout. For example, a reference number labeling a singular form of an element within the figures may be used to reference a plurality of the singular element within the text of the disclosure.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/ or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 2:
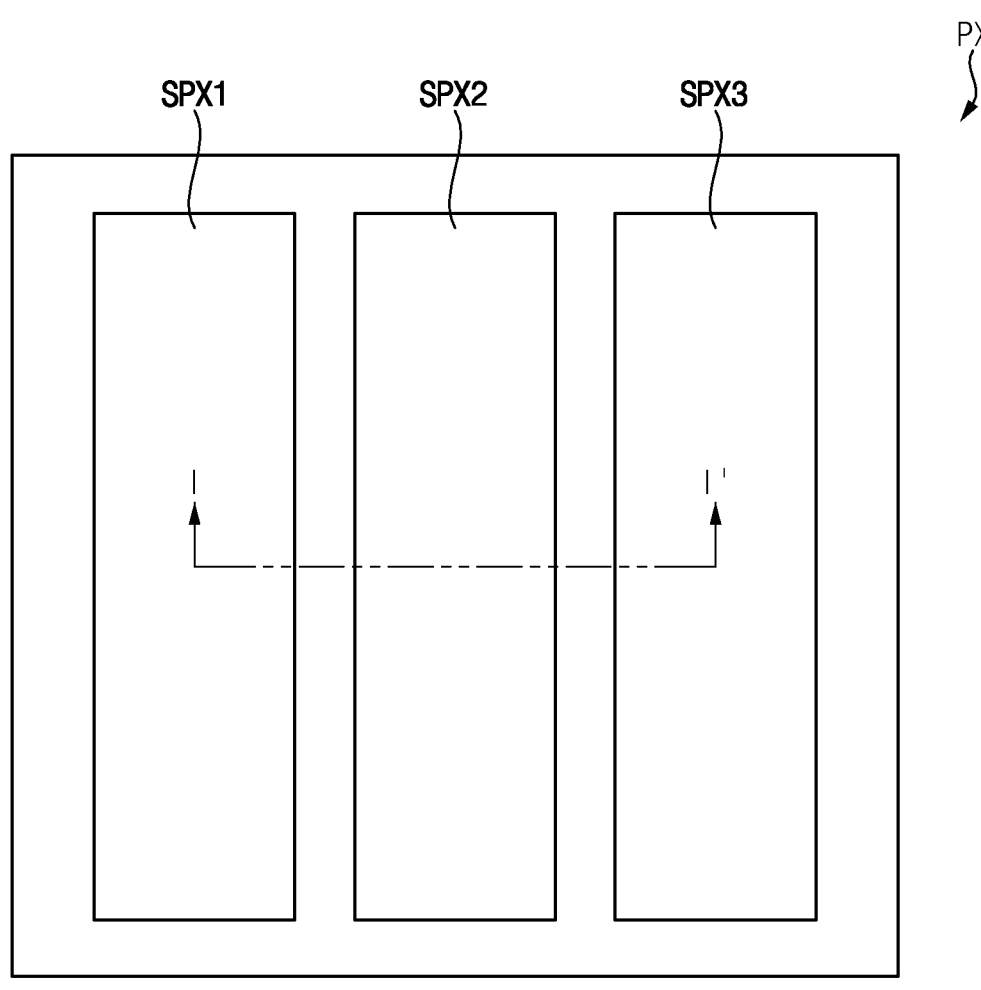
FIG. 2 is a plan view illustrating a pixel included in the display device of FIG. 1.
Figure 2:
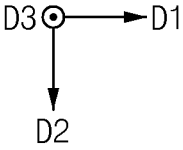

FIG. 1 is a plan view illustrating a display device 10 according to an embodiment. FIG. 2 is a plan view illustrating a pixel PX included in the display device 10 of FIG. 1.

Referring to FIGS. 1 and 2, the display device 10 according to an embodiment may be divided into a display area DA and a peripheral area PA. The display area DA may display an image, and the peripheral area PA may be located adjacent to the display area DA such as being around the display area DA. For example, the peripheral area PA may surround the display area DA. In an embodiment, an image may not be displayed at the peripheral area PA to define the peripheral area PA as a non-display area, without being limited thereto. Various components or layers of the display device 10 may include a display area DA and a peripheral area PA corresponding to those described above.

In an embodiment, the display device 10 may have a rectangular shape on a plane (e.g., a planar shape of a rectangle in a plan view). However, the invention is not necessarily limited thereto, and the display device 10 may have various shapes on a plane. In this case, the plane may be defined from a first direction D1 and a second direction D2 which intersects the first direction D1. A third direction D3 may cross the plane such as to be perpendicular to the plane. The third direction D3 may be referred to as a front direction of the display device 10. A thickness of the display device 10 and various components or layers thereof may be defined along the third direction D3.

The display device 10 may include the pixel PX as a display element provided in plural including a plurality of pixels PX disposed in the display area DA. For example, the pixels PX may be arranged in a matrix form along the first direction D1 and the second direction D2.

Each of the pixels PX may include a plurality of sub-pixels which generate and/or emit light of different colors. In an embodiment, each of the pixels PX may include first to third sub-pixels SPX1, SPX2, and SPX3 emitting light of different colors. For example, the first sub-pixel SPX1 may emit red light, the second sub-pixel SPX2 may emit green light, and the third sub-pixel SPX3 may emit blue light. However, the invention is not necessarily limited thereto. For example, the first to third sub-pixels SPX1, SPX2, and SPX3 may be combined so that each of the pixels PX emits yellow, cyan, and magenta lights.

Each of the first to third sub-pixels SPX1, SPX2, and SPX3 may include a driving device TR and a light emitting device LED which is connected to the driving device TR. The driving device TR may generate a driving current (e.g., an electrical current) and provide the generated driving current to the light emitting device LED. The light emitting device LED may emit light based on the driving current. For example, the light emitting device LED may include an organic light emitting diode, an inorganic light emitting diode, or a quantum dot light emitting diode.

Figure 3:
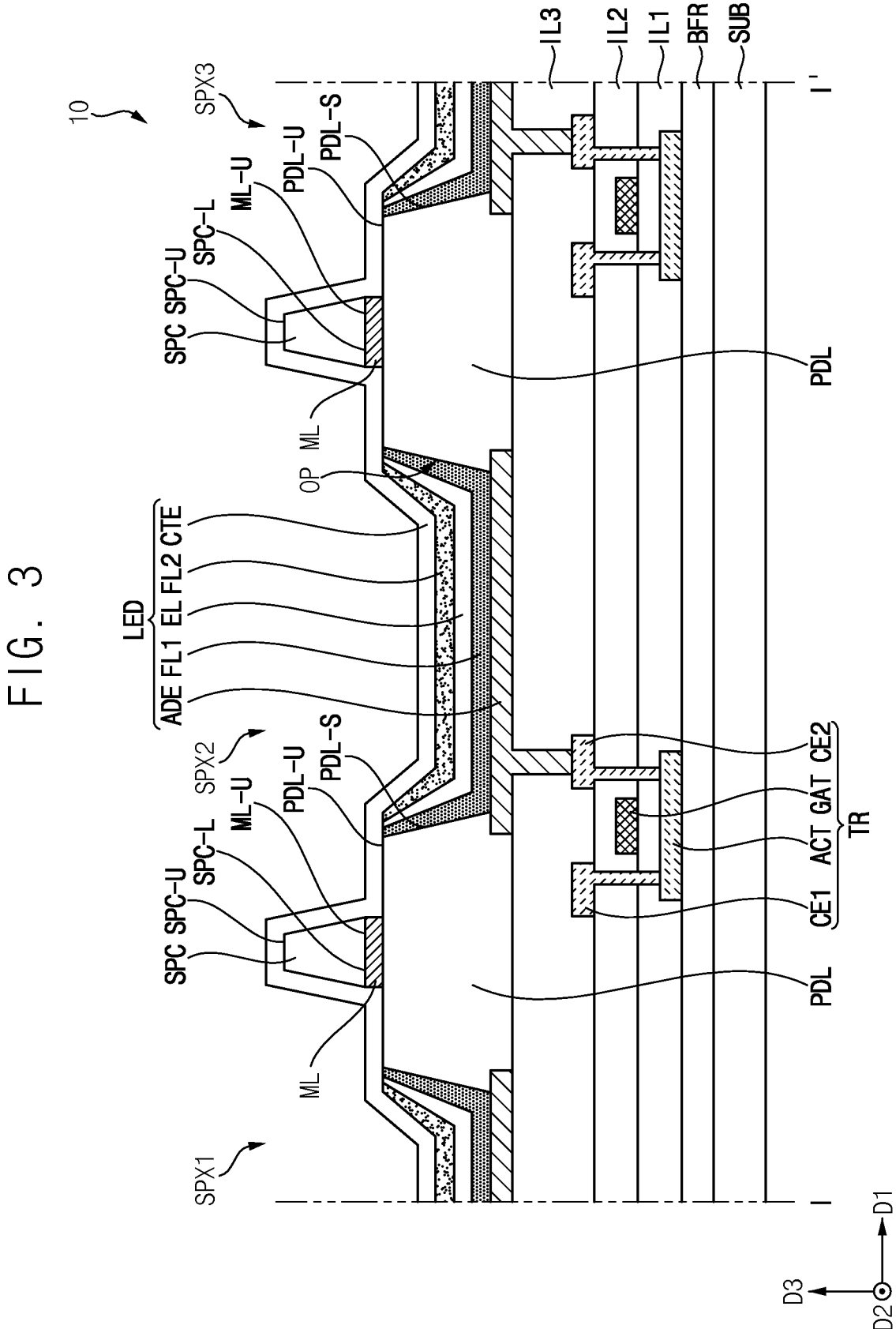
FIG. 3 is a cross-sectional view taken along line I-I' of FIG. 2.

FIG. 3 is a cross-sectional view taken along line I-I' of FIG. 2. For example, FIG. 3 may be a cross-sectional view illustrating a cross-sectional structure of the pixel PX included in the display device 10.

Referring to FIGS. 1 to 3, in an embodiment, the display device 10 may include a substrate SUB, a buffer layer BFR, a driving device TR, a plurality of insulating layers IL1, IL2, IL3, a pixel defining layer PDL, a light emitting device LED, a metal layer ML as a metal pattern of a metal pattern layer, and a spacer SPC within a spacer layer. The driving device TR may include an active pattern ACT of an active layer, a gate electrode GAT, a first connection electrode CE1 and a second connection electrode CE2. The light emitting device LED may include a pixel electrode ADE, a first functional layer FL1, a light emitting layer EL, a second functional layer FL2, and a common electrode CTE.

The driving device TR and the light emitting device LED may be included in each of the first to third sub-pixels SPX1, SPX2, and SPX3. For example, a driving device TR of the first sub-pixel SPX1 may be adjacent to a driving device TR of the second sub-pixel SPX2, and the driving device TR of the second sub-pixel SPX2 may be adjacent to a driving device TR of the third sub-pixel SPX3. Also, a light emitting device LED as a light emitting element of the first sub-pixel SPX1 may be adjacent to a light emitting device LED of the second sub-pixel SPX2, and the light emitting device LED of the second sub-pixel SPX2 may be adjacent to a light emitting device LED of the third sub-pixel SPX3. A plurality of the driving devices may be in a driving layer or pixel circuit layer, while a plurality of the light emitting devices may be in a light emitting element layer or display element layer.

The substrate SUB may include a transparent or opaque material. In an embodiment, examples of materials that can be used as the substrate SUB may include glass, quartz, plastic, or the like. These may be used alone or in combination with each other.

The buffer layer BFR may be disposed on the substrate SUB. The buffer layer BFR may prevent diffusion of impurities such as oxygen, moisture, or the like to an upper portion of the substrate SUB through the substrate SUB. The buffer layer BFR may include an inorganic insulating material such as a silicon material (or compound) or a metal oxide. Examples of the inorganic insulating material may include silicon oxide, silicon nitride, and silicon oxynitride. These may be used alone or in combination with each other. The buffer layer BFR may have a single-layer structure or a multi-layer structure including a plurality of insulating layers.

Although not shown, in an embodiment, a barrier layer may be additionally disposed between the substrate SUB and the buffer layer BFR. The barrier layer may include an inorganic insulating material The active pattern ACT may be disposed on the buffer layer BFR. In an embodiment, the active pattern ACT may include a silicon semiconductor material or an oxide semiconductor material. Examples of the silicon semiconductor material that can be used as the active pattern ACT may include amorphous silicon and polycrystalline silicon. Examples of the oxide semiconductor material that can be used as the active pattern ACT may include IGZO (In-GaZnO) and ITZO (InSnZnO). In addition, the oxide semi-conductor material may further include indium (In), gallium (Ga), tin (Sn), zirconium (Zr), vanadium (V), hafnium (Hf), cadmium (Cd), germanium (Ge), chromium (Cr)), titanium (Ti), and zinc (Zn). These may be used alone or in combination with each other.

In an embodiment, the first insulating layer IL1 may be disposed on the buffer layer BFR. The first insulating layer IL1 may cover the active pattern ACT. In another embodiment, the first insulating layer IL1 may be disposed in a pattern shape to include discrete patterns in the plan view which are on the active pattern ACT to expose a portion of the active pattern ACT to outside the first insulating layer IL1. For example, the first insulating layer IL1 may be disposed on the active pattern ACT in a pattern shape to overlap (or correspond to) the gate electrode GAT. The first insulating layer IL1 may include an inorganic insulating material. Examples of inorganic insulating materials that can be used as the first insulating layer IL1 may include silicon oxide, silicon nitride, and silicon oxynitride. These may be used alone or in combination with each other.

The gate electrode GAT may be disposed on the first insulating layer IL1. In an embodiment, the gate electrode GAT may include a metal, an alloy, a conductive metal oxide, a transparent conductive material, or the like. Examples of materials that can be used as the gate electrode GAT may include silver (Ag), an alloy containing silver, molybdenum (Mo), an alloy containing molybdenum, aluminum (Al), an alloy containing aluminum, and aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), or the like. These may be used alone or in combination with each other.

The second insulating layer IL2 may be disposed on the first insulating layer IL1. In an embodiment, the second insulating layer IL2 may cover the gate electrode GAT. The second insulating layer IL2 may include an inorganic insulating material. Examples of inorganic insulating materials that can be used as the second insulating layer IL2 may include silicon oxide, silicon nitride, and silicon oxynitride. These may be used alone or in combination with each other.

The first connection electrode CE1 and the second connection electrode CE2 may be disposed on the second insulating layer IL2. The first connection electrode CE1 and the second connection electrode CE2 may be electrically connected to the active pattern ACT through a contact hole formed (or provided) in the second insulating layer IL2. Each of the first connection electrode CE1 and the second connection electrode CE2 may include a metal, an alloy, a conductive metal oxide, a transparent conductive material, or the like. Examples of materials that can be used as the first connection electrode CE1 and the second connection electrode CE2 may include silver (Ag), an alloy containing silver, molybdenum (Mo), an alloy containing molybdenum, aluminum (Al), Alloys containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), or the like. These may be used alone or in combination with each other.

The third insulating layer IL3 may be disposed on the second insulating layer IL2. The third insulating layer IL3 may cover the first connection electrode CE1 and the second connection electrode CE2. The third insulating layer IL3 may include an organic insulating material. Examples of organic insulating materials that can be used as the third insulating layer IL3 may include photoresist, polyacryl-based resin, polyimide-based resin, and polyamide-based resin, siloxane-based resin, acrylic-based resin, epoxy-based resin, or the like. These may be used alone or in combination with each other. The third insulating layer IL3 may have a single-layer structure or a multi-layer structure including a plurality of insulating layers.

A configuration, an arrangement structure, and a connection structure of the driving device TR relative to each of the plurality of insulating layers IL1, IL2, and IL3 described with reference to FIG. 3 is only an example, and may be variously changed.

The pixel electrode ADE may be disposed on the third insulating layer IL3. The pixel electrode ADE may be electrically connected to the driving device TR through a contact hole formed in the third insulating layer IL3. In an embodiment, the pixel electrode ADE may include a metal, an alloy, a conductive metal oxide, a transparent conductive material, or the like. Examples of materials that can be used as the pixel electrode ADE may include silver (Ag), an alloy containing silver, molybdenum (Mo), an alloy containing molybdenum, aluminum (Al), an alloy containing aluminum, and aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), or the like.

The pixel defining layer PDL may be disposed on the third insulating layer IL3. In an embodiment, the pixel defining layer PDL may include an organic insulating material. Examples of organic insulating materials that can be used as the pixel defining layer PDL may include photoresist, poly-acrylic resin, polyimide resin, and acrylic resin. These may be used alone or in combination with each other.

In an embodiment, the pixel defining layer PDL may define an opening OP exposing a portion of the pixel electrode ADE to outside the pixel defining layer PDL. For example, the pixel defining layer PDL may cover a peripheral portion of the pixel electrode ADE and expose a central portion of the pixel electrode ADE. The opening OP may be defined from (or by) a side surface PDL-S of the pixel defining layer PDL.

In an embodiment, an upper surface PDL-U of the pixel defining layer PDL may have liquid repellency. In this specification, liquid repellency may mean a property that repels a predetermined solution and does not permeate the solution well. For example, a surface bonding force of the solution with a surface having liquid repellency is relatively small, and a surface tension of the solution disposed on the a surface having liquid repellency may increase.

The upper surface PDL-U of the pixel defining layer PDL may be a surface of the pixel defining layer PDL that is farthest from the substrate SUB. The side surface PDL-S of the pixel defining layer PDL may be connected to or extend from the upper surface PDL-U of the pixel defining layer PDL. In other words, the side surface PDL-S of the pixel defining layer PDL may meet the upper surface PDL-U of the pixel defining layer PDL.

In an embodiment, the pixel defining layer PDL may be formed or provided from a composition for forming a pixel defining layer material including a liquid repellent agent. In the process of forming the pixel defining layer PDL, the liquid repellent agent may be concentrated in an area of the pixel defining layer PDL adjacent to the upper surface PDL-U of the pixel defining layer PDL. That is, the liquid repellent agent may be concentrated at a thickness portion of the pixel defining layer PDL which is closest to the upper surface PDL-U of the pixel defining layer PDL along a thickness direction of the display device 10, without being limited thereto. Accordingly, the upper surface PDL-U of the pixel defining layer PDL may have liquid repellency. The liquid repellent agent may include a fluorine-based material.

However, the invention is not necessarily limited thereto, and the process of making the upper surface PDL-U of the pixel defining layer PDL have liquid repellency may vary. For example, the upper surface PDL-U of the pixel defining layer PDL may have liquid repellency by performing a separate liquid repellency treatment on the pixel defining layer PDL. In another embodiment, the liquid repellency treatment may be performed by exposing the pixel defining layer PDL to a reactive gas containing a fluorine material. In still another embodiment, the upper surface PDL-U of the pixel defining layer PDL may have liquid repellency by forming a separate liquid repellent pattern on the upper surface PDL-U of the pixel defining layer PDL.

The first functional layer FL1 may be disposed on the pixel electrode ADE. The first functional layer FL1 may overlap the opening OP of the pixel defining layer PDL. For example, the first functional layer FL1 may be disposed within the opening OP of the pixel defining layer PDL. The first functional layer FL1 may extend along the pixel electrode ADE and along the sidewall of the pixel defining layer PDL which defines the opening OP.

The first functional layer FL1 may include at least one of a hole injection layer (HIL) and a hole transport layer (HTL). The hole injection layer and the hole transport layer may easily transport holes injected from the pixel electrode ADE. The hole injection layer may include CuPc or starburst type amines such as TCTA, m-MTDATA, IDE406, or the like. The hole transport layer may include TPD or α-TPD. In other embodiments, the first functional layer FL1 may be omitted.

The light emitting layer EL may be disposed on the first functional layer FL1. The light emitting layer EL may overlap the opening OP of the pixel defining layer PDL. For example, the light emitting layer EL may be disposed within the opening OP of the pixel defining layer PDL.

In an embodiment, the light emitting layer EL may include at least one of an organic light emitting material and quantum dots.

In an embodiment, the organic light emitting material may include a low molecular organic material or a high molecular organic material. Examples of the low molecular organic material may include copper phthalocyanine, diphenylbenzidine, tris-(8-hydroxyquinoline)aluminum, or the like. Examples of the high molecular organic material may include poly(3,4-ethylenedioxythiophene), polyaniline, poly-phenylenevinylene, polyfluorene, or the like. These may be used alone or in combination with each other.

In an embodiment, the quantum dot may include a core including a group II-VI material, a group III-V material, a group IV-VI material, a group IV element, a group IV material, and combinations thereof. In an embodiment, the quantum dot may have a core-shell structure including the core and a shell surrounding the core. The shell may serve as a protective layer for maintaining semiconductor properties by preventing chemical deterioration of the core and as a charging layer for imparting electrophoretic properties to the quantum dot.

The second functional layer FL2 may be disposed on the light emitting layer EL. The second functional layer FL2 may overlap the opening OP of the pixel defining layer PDL. For example, the second functional layer FL2 may be disposed within the opening OP of the pixel defining layer PDL.

The second functional layer FL2 may include at least one of an electron transporting layer (ETL) and an electron injection layer (EIL). The electron injection layer and the electron transport layer may easily transport electrons injected from the common electrode CTE. The electron transport layer may include Alq3, PBD, TNF, BMD, BND, or the like. The electron injection layer may include LiF, LiQ, NaCl, CsF, LiO, BaO, or the like. In other embodiments, the second functional layer FL2 may be omitted.

The metal layer ML may be disposed on the pixel defining layer PDL. The metal layer ML may be spaced apart from the pixel electrode ADE. The metal layer ML may be spaced apart from the pixel electrode ADE in a direction along the pixel circuit layer (or along the substrate SUB). In an embodiment, the metal layer ML may be disposed to correspond to the spacer SPC. For example, the metal layer ML may be disposed under the spacer SPC. In other words, the metal layer ML may be disposed between the pixel defining layer PDL and the spacer SPC. Accordingly, the metal layer ML may separate the spacer SPC from the upper surface PDL-U of the pixel defining layer PDL.

In an embodiment, the metal layer ML may partially cover the upper surface PDL-U of the pixel defining layer PDL. In other words, the metal layer ML may cover a portion of the upper surface PDL-U of the pixel defining layer PDL, and expose a portion of the upper surface PDL-U of the pixel defining layer PDL and the side surface PDL-S of the pixel defining layer PDL. The portion of the upper surface PDL-U and the side surface PDL-S which are exposed may define an exposed portion of the pixel defining layer PDL which is exposed to outside the metal layer ML. In this case, an upper surface ML-U of the metal layer ML may be entirely covered by the spacer SPC. The upper surface PDL-U of the metal layer ML may be a surface of the metal layer ML that is farthest from the substrate SUB.

In an embodiment, the metal layer ML may include a metal material soluble in water when oxidized. Accordingly, when the metal layer ML is exposed to oxygen and oxidized, it may be dissolved by water such as distilled water. An example of the metal material that can be used as the metal layer ML may include molybdenum (Mo). When molybdenum (Mo) is exposed to oxygen, molybdenum oxide (MoOx) may be formed, and molybdenum oxide (MoOx) may be soluble in water.

The spacer SPC may overlap the pixel defining layer PDL on a plane. When a structure or the like that faces the substrate SUB in the third direction D3 is bonded and/or deposited on the substrate SUB in a process of forming various components and layers of the display device 10, the spacer SPC may maintain a distance between the substrate SUB and the structure. In addition, damage to the display device 10 due to external shock or the like can be minimized or prevented during the process.

The spacer SPC may be disposed on (or provided on) the metal layer ML. In other words, on a plane, the spacer SPC may overlap the metal layer ML. Accordingly, the spacer SPC may be spaced apart from the upper surface PDL-U of the pixel defining layer PDL by the metal layer ML. In other words, the spacer SPC may not contact the upper surface PDL-U of the pixel defining layer PDL, by the metal layer ML. Accordingly, surface characteristics of the pixel defining layer PDL may not affect the spacer SPC. For example, even when the upper surface PDL-U of the pixel defining layer PDL has liquid repellency, since the spacer SPC is not directly disposed on the upper surface PDL-U of the pixel defining layer PDL, the spacer SPC may not be affected by liquid repellency of the upper surface PDL-U of the pixel defining layer PDL.

In an embodiment, the spacer SPC may entirely cover the upper surface ML-U of the metal layer ML. In other words, the upper surface ML-U of the metal layer ML may not be exposed to the outside of the spacer layer by the spacer SPC.

The spacer SPC may include an organic insulating material. Examples of organic insulating materials that can be used as the spacer SPC may include photoresist, polyacrylic resin, polyimide resin, and acrylic resin.

In an embodiment, the spacer SPC may include oxygen atoms. The oxygen atoms may be dispersed in the spacer SPC. In an embodiment, a content of the oxygen atoms included in the spacer SPC may be partially non-uniform. For example, in the spacer SPC, a content of the oxygen atoms in an area adjacent to the upper surface SPC-U of the spacer SPC may be greater than a content of the oxygen atoms in an area adjacent to a lower surface SPC-L of the spacer SPC which is closer to the metal layer ML than the upper surface SPC-U. In other words, in the spacer SPC, the oxygen atoms included in the spacer SPC may be more densely distributed in an area adjacent to the upper surface SPC-U of the spacer SPC.

The upper surface SPC-U of the spacer SPC may be a surface of the spacer SPC that is farthest from the substrate SUB, and the lower surface SPC-L of the spacer SPC may be a surface of the spacer SPC that is closest to the substrate SUB.

Referring to FIG. 3, the spacer SPC is illustrated as having a trapezoidal cross-sectional shape, but the invention is not necessarily limited thereto, and the spacer SPC may have various cross-sectional shapes. For example, the spacer SPC may have a rectangular cross-sectional shape. Also, the number of spacer SPC shown in FIG. 3 is only an example, and the number of the spacer SPC arranged along the pixel defining layer PDL may vary.

The common electrode CTE may be disposed to cover the second functional layer FL2, the pixel defining layer PDL, the metal layer ML, and the spacer SPC. For example, the common electrode CTE may continuously extend over the plurality of pixels PX to be commonly disposed in the plurality of pixels PX. The common electrode CTE may include a metal, an alloy, a conductive metal nitride, a conductive metal oxide, a transparent conductive material, or the like. The common electrode CTE may have a single-layer structure or a multi-layer structure including a plurality of conductive layers.

According to embodiments, the display device 10 may include a metal layer ML disposed between the pixel defining layer PDL and the spacer SPC, and the spacer SPC may be spaced apart from the upper surface PDL-U of the pixel defining layer PDL by the metal layer ML, along the thickness direction. In other words, the spacer SPC may not contact the upper surface PDL-U of the pixel defining layer PDL by the metal layer ML. Accordingly, surface characteristics of the pixel defining layer PDL may not affect the spacer SPC. Accordingly, reliability of the stacked structure of the display device 10 may be improved.

FIGS. 4 to 15 are cross-sectional views illustrating a method of manufacturing (or providing) the display device of FIG. 1.

Referring to FIG. 4, the driving device TR may be formed (or provided) on the substrate SUB.

First, the buffer layer BFR may be formed on the substrate SUB. After that, the active pattern ACT may be formed on the buffer layer BFR. The active pattern ACT may be formed using an oxide semiconductor, a silicon semiconductor, an organic semiconductor, or the like.

The first insulating layer IL1 may be formed on the buffer layer BFR. The first insulating layer IL1 may cover the active pattern ACT on the buffer layer BFR. The first insulating layer IL1 may be formed using an inorganic insulating material.

The gate electrode GAT may be formed on the first insulating layer IL1. The gate electrode GAT may be formed using a metal, an alloy, a conductive metal oxide, a transparent conductive material, or the like.

The second insulating layer IL2 may be formed on the first insulating layer IL1. The second insulating layer IL2 may cover the gate electrode GAT on the first insulating layer IL1. The second insulating layer IL2 may be formed using an inorganic insulating material.

Contact holes may be formed in the first insulating layer IL1 and the second insulating layer IL2. In addition, the first connection electrode CE1 and the second connection electrode CE2 may be formed on the second insulating layer IL2 to overlap each of the contact holes. The contact holes may expose the active pattern ACT to outside a respective insulating layer (e.g., one or more of the first insulating layer IL1 and the second insulating layer IL2).

Each of the first connection electrode CE1 and the second connection electrode CE2 may be formed using a metal, an alloy, a conductive metal oxide, a transparent conductive material, or the like. Each of the first connection electrode CE1 and the second connection electrode CE2 may be connected to the active pattern ACT, at or through each of the contact holes. Accordingly, the driving device TR including the active pattern ACT together with the gate electrode GAT, the first connection electrode CE1 and the second connection electrode CE2, may be formed on the substrate SUB.

The third insulating layer IL3 may be formed on the second insulating layer IL2. The third insulating layer IL3 may cover the first connection electrode CE1 and the second connection electrode CE2 on the second insulating layer IL2. The third insulating layer IL3 may be formed using an organic insulating material.

Contact holes may be formed in the third insulating layer IL3 to overlap the second connection electrode CE2. The contact holes may expose the second connection electrode CE2 to outside the third insulating layer IL3. In addition, the pixel electrode ADE may be formed on the third insulating layer IL3 to overlap each of the contact holes. The pixel electrode ADE may be formed using a metal, an alloy, a conductive metal oxide, a transparent conductive material, or the like.

Figure 5:
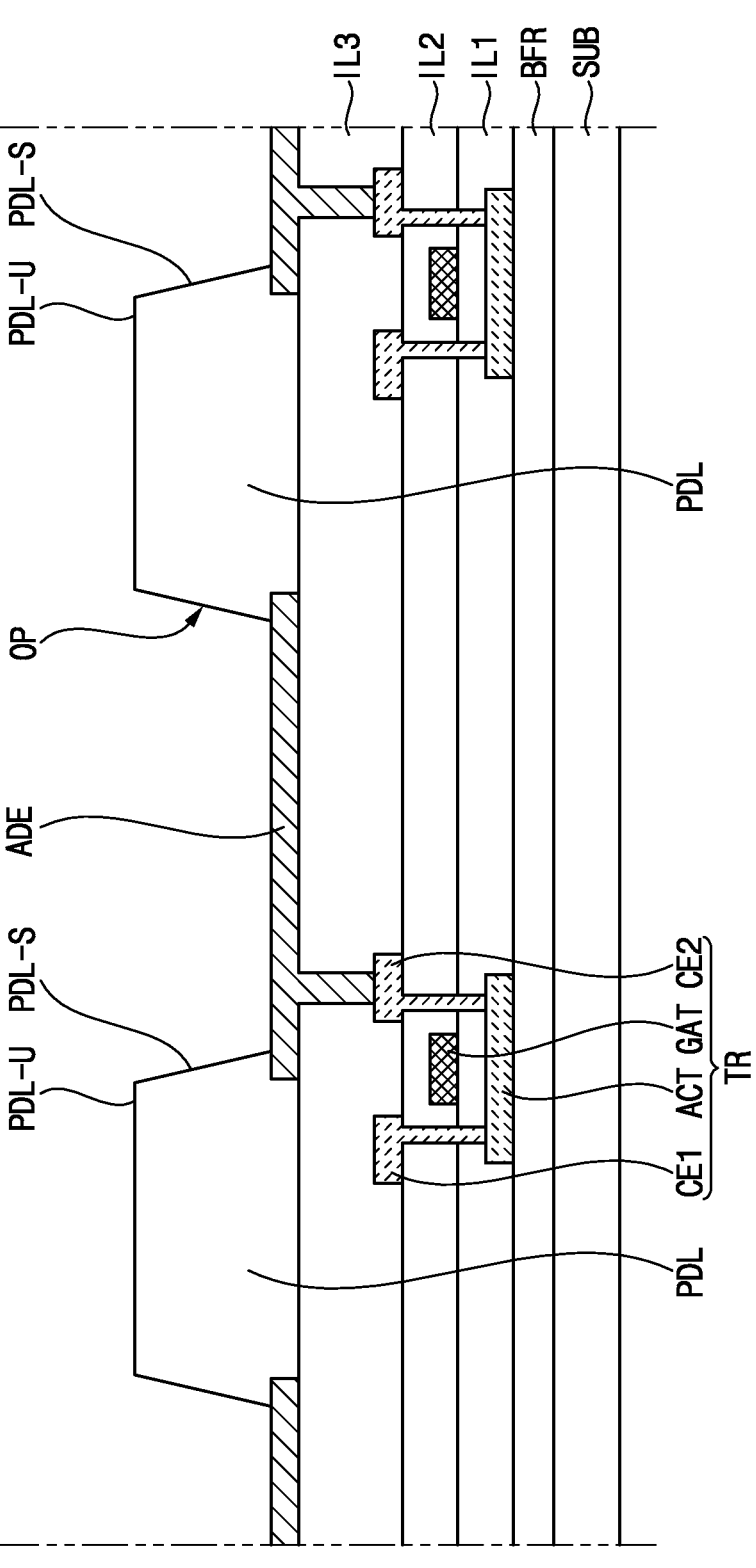

Referring to FIG. 5, the pixel defining layer PDL may be formed on the third insulating layer IL3. In an embodiment, the pixel defining layer PDL may be formed by applying a composition for forming the pixel defining layer PDL which covers an entirety of the third insulating layer IL3 and the pixel electrode ADE, and then performing a photolithography process to provide a plurality of pixel defining patterns of the pixel defining layer PDL. The pixel defining patterns may be solid portions of the material for forming the pixel defining layer PDL. Accordingly, the pixel defining patterns of the pixel defining layer PDL may define an opening OP between adjacent pixel defining patterns and exposing a portion of the upper surface of the pixel electrode ADE to outside the pixel defining layer PDL. The opening OP may be formed to expose a portion of the upper surface of the pixel electrode ADE. The opening OP may be defined from (or by) the side surface PDL-S of the pixel defining layer PDL. The opening OP may correspond to a recess defined by the side surface PDL-S of the pixel defining layer PDL together with the upper surface of the pixel electrode ADE, where the recess is recessed from a plane corresponding to the upper surface PDL-U of the pixel defining layer PDL.

In an embodiment, the composition for forming the pixel defining layer PDL may include a liquid repellent agent as a liquid-repelling material. The liquid repellent agent may be concentrated in an area of the pixel defining layer PDL which is adjacent to (or closest to) the upper surface PDL-U of the pixel defining layer PDL. Accordingly, the upper surface PDL-U of the pixel defining layer PDL may have liquid repellency. In an embodiment, an upper portion of the side surface PDL-S which extends from and is closest to the upper surface PDL-U may also have liquid repellency, without being limited thereto. The liquid repellent agent may include a fluorine-based material.

In another embodiment, a separate liquid repellency treatment may be performed on the pixel defining layer PDL. For example, the liquid repellency treatment may be performed by exposing the pixel defining layer PDL to a reactive gas containing a fluorine material. Accordingly, the upper surface PDL-U of the pixel defining layer PDL may be formed to have liquid repellency. In still another embodiment, a separate liquid repellent pattern may be formed on the upper surface PDL-U of the pixel defining layer PDL.

Figure 6:
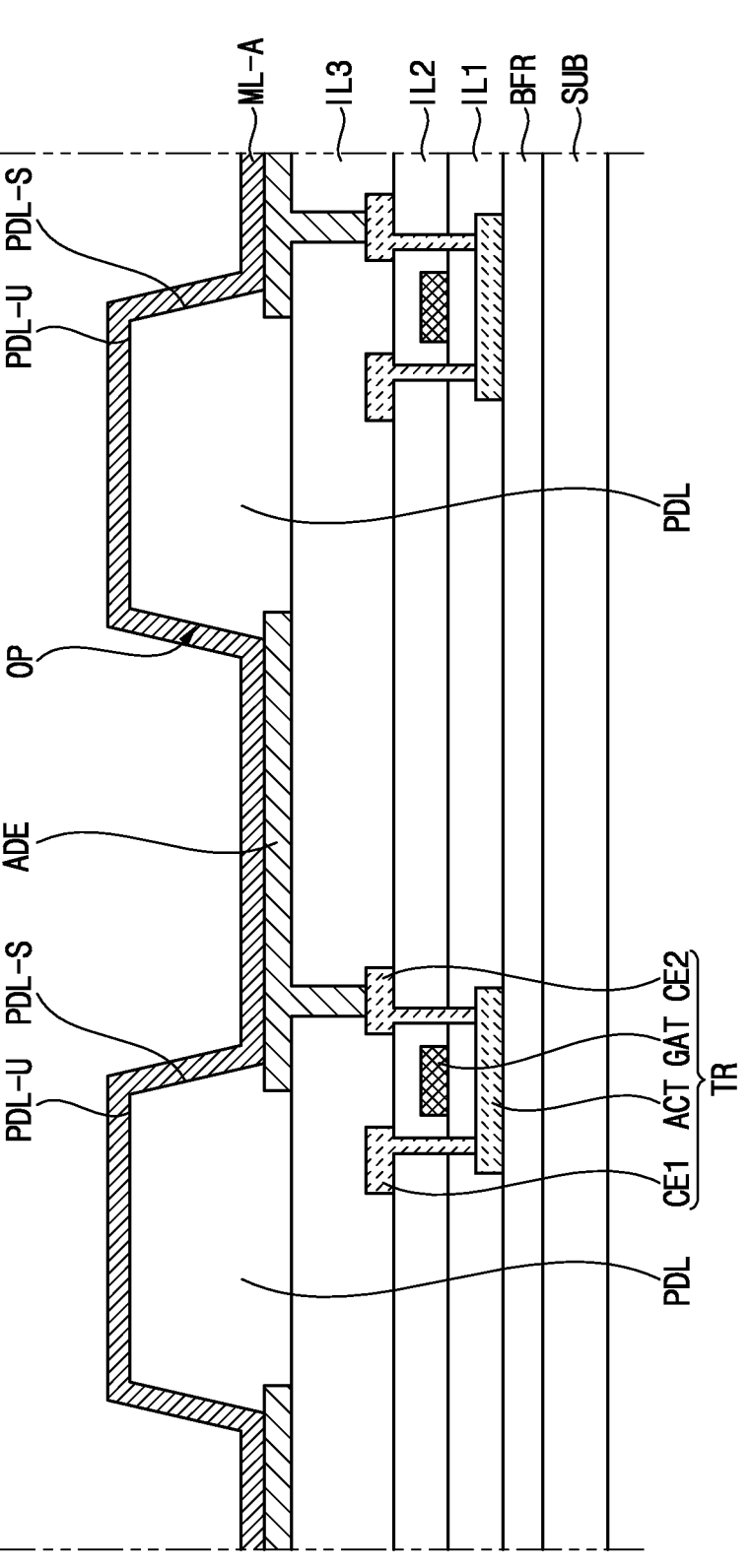

Referring to FIG. 6, a preliminary metal layer ML-A may be formed to cover the pixel electrode ADE and the pixel defining layer PDL. In an embodiment, the preliminary metal layer ML-A may be formed of a metal material soluble in water when oxidized. For example, the preliminary metal layer ML-A may be formed of molybdenum (Mo).

Figure 7:
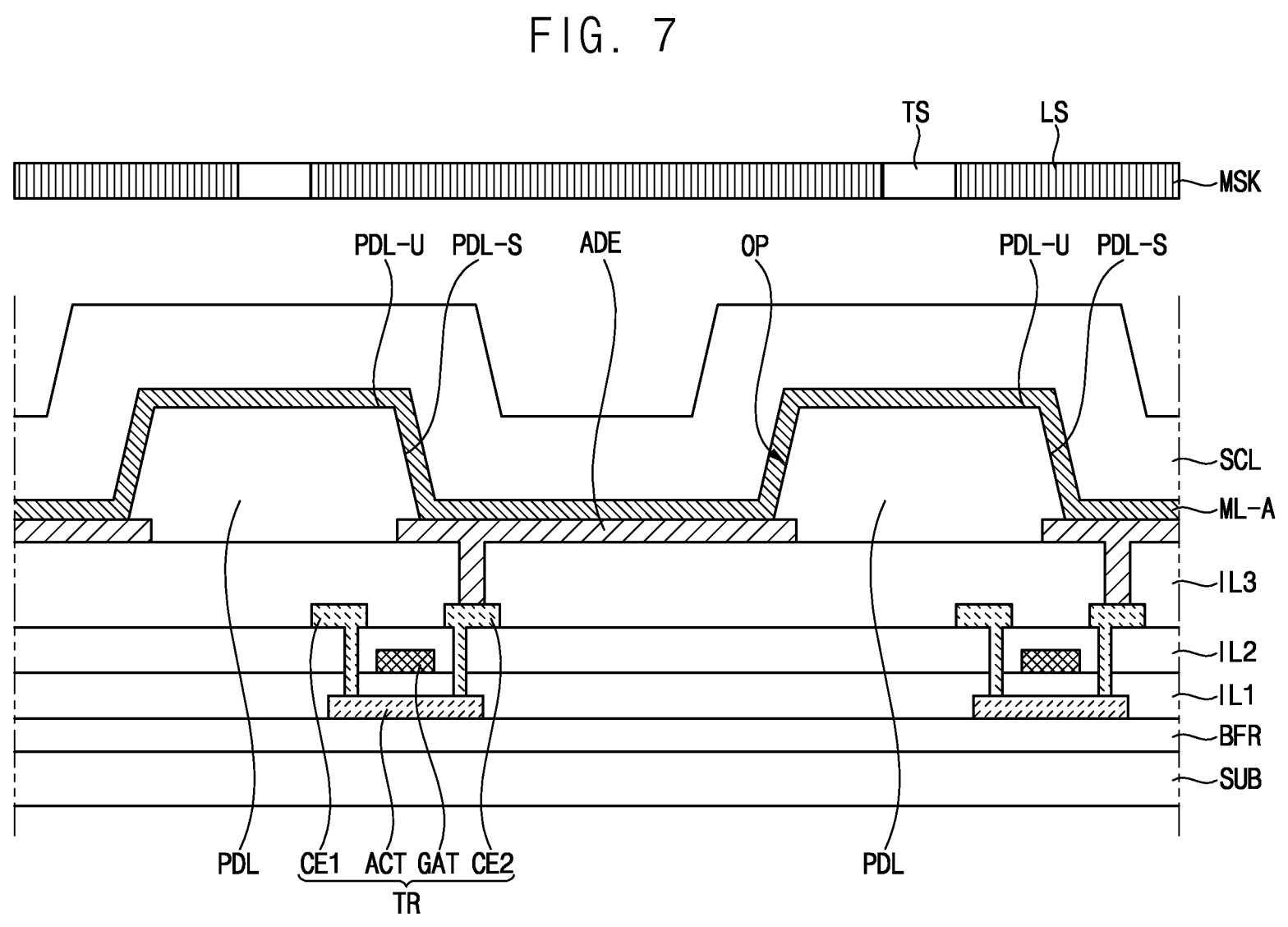

Referring to FIG. 7, a spacer composition layer SCL may be formed on the preliminary metal layer ML-A. In an embodiment, the spacer composition layer SCL may entirely cover the preliminary metal layer ML-A.

In an embodiment, the spacer composition layer SCL may be formed by applying an organic insulating material on the preliminary metal layer ML-A. Examples of organic insulating materials that can be used as the spacer composition layer SCL may include photoresist, polyacrylic resin, polyimide resin, acrylic resin, or the like.

The spacer composition layer SCL may not contact the pixel defining layer PDL owing to the preliminary metal layer ML-A spacing the spacer composition layer SCL from the pixel defining layer PDL. Accordingly, surface characteristics of the pixel defining layer PDL such as the liquid repellency thereof, may not affect the process of or the material for forming the spacer composition layer SCL.

For example, when the upper surface PDL-U of the pixel defining layer PDL has liquid repellency, if the spacer composition layer SCL is directly formed on the pixel defining layer PDL, the spacer composition layer SCL may not be uniformly formed on the pixel defining layer PDL. In other words, a defect in the process of forming the spacer SPC may occur due to liquid repellency of the upper surface PDL-U of the pixel defining layer PDL.

However, according to one or more embodiments, the spacer composition layer SCL may not contact the upper surface PDL-U of the pixel defining layer PDL due to the preliminary metal layer ML-A disposed therebetween. Accordingly, when the spacer composition layer SCL is formed, the liquid repellency of the upper surface PDL-U of the pixel defining layer PDL does not influence the spacer composition layer SCL. Accordingly, the spacer composition layer SCL may be uniformly formed on the preliminary metal layer ML-A. Accordingly, occurrence of defects in a process of forming the spacer SPC may be minimized or prevented. Accordingly, reliability of the stacked structure of the display device 10 may be improved.

Figure 8:
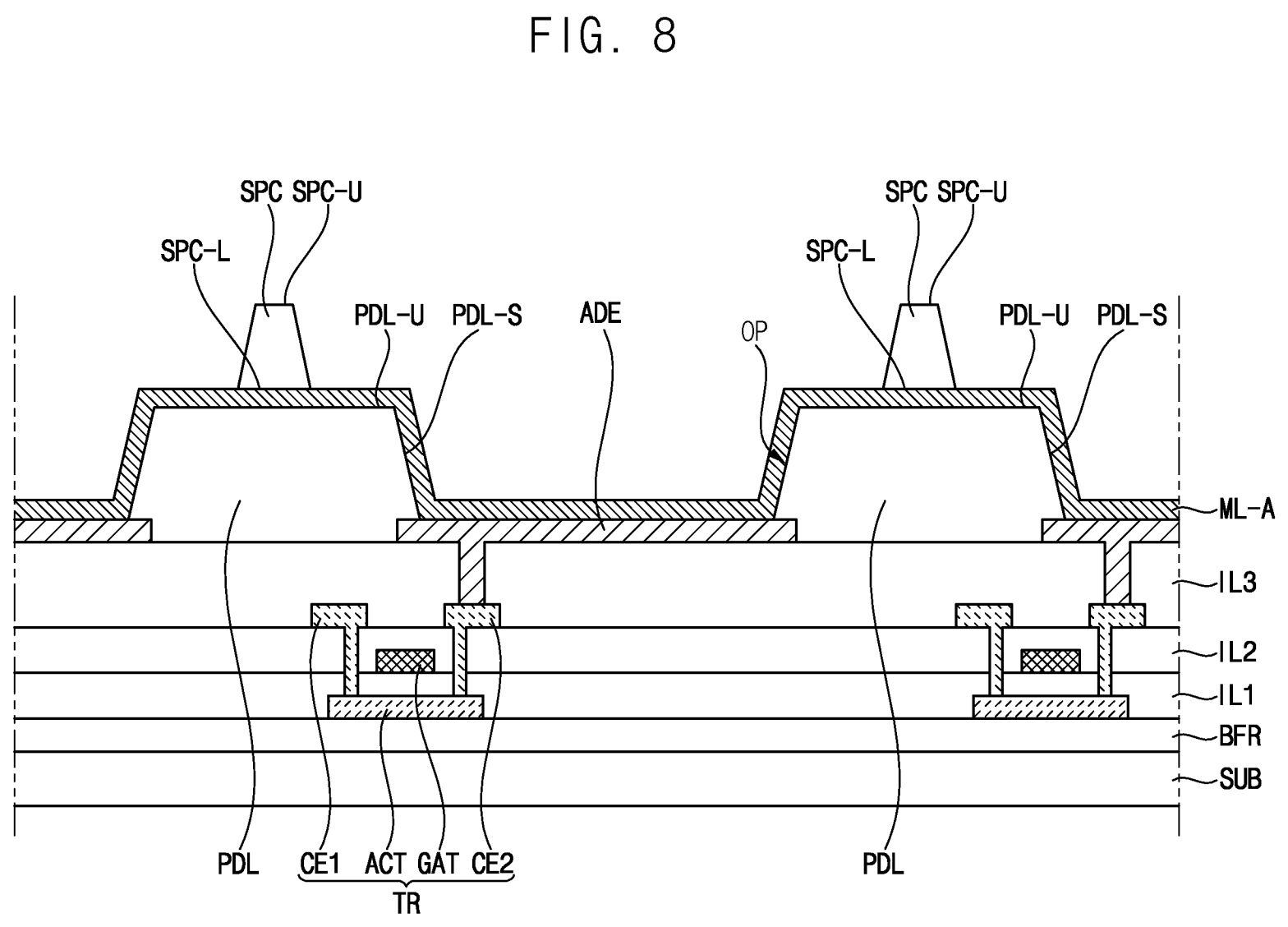

Referring to FIG. 8 taken with FIG. 7, the spacer composition layer SCL may be patterned to form the spacer SPC as a solid portion of the spacer layer. A plurality of spacers may be provided from the spacer composition layer SCL, to be in a same layer as each other. As being in a same layer, elements may be formed in a same process and/or as including a same material as each other, elements may be respective portions of a same material layer, elements may be on a same layer by forming an interface with a same underlying or overlying layer, etc., without being limited thereto.

As shown in FIG. 8, the spacer SPC may be formed to cover a portion of the preliminary metal layer ML-A and expose a remaining portion of the preliminary metal layer ML-A. The remaining portion of the preliminary metal layer ML-A may extend further than the spacer SPC in a direction along the substrate SUB.

In an embodiment, the spacer SPC may be formed through an exposure process using a mask MSK. For example, the spacer SPC may be formed by disposing the mask MSK on the spacer composition layer SCL, and then exposing and developing the spacer composition layer SCL.

In an embodiment, the mask MSK may include a light blocking part LS (e.g., a light blocking portion or light blocking area) and a light transmitting part TS (e.g., a light transmitting portion of light transmitting area). In an embodiment, the light blocking part LS may be an area blocking incident light incident on the mask MSK. The light transmitting part TS may be an area through which the incident light for patterning is transmitted.

Accordingly, the incident light may not be irradiated to an area of the spacer composition layer SCL corresponding to the light blocking part LS of the mask MSK. In addition, most of the incident light may be irradiated to an area corresponding to the light transmitting part TS of the mask MSK.

When the spacer composition layer SCL is developed, the spacer composition layer SCL corresponding to the light blocking part LS may be removed, and the spacer composition layer SCL corresponding to the light transmitting part TS may remain. Accordingly, as shown in FIG. 8, the spacer SPC covering the portion of the preliminary metal layer ML-A, and exposing the remaining portion of the preliminary metal layer ML-A may be formed.

In FIGS. 7 and 8, a case where the spacer composition layer SCL includes a negative photosensitive material has been described as an example, but the invention is not necessarily limited thereto, and in another embodiment, the spacer composition layer SCL may include a positive photosensitive material. In this case, areas of the mask MSK corresponding to the light blocking part LS and the light transmitting part TS may be opposite.

Figure 9:
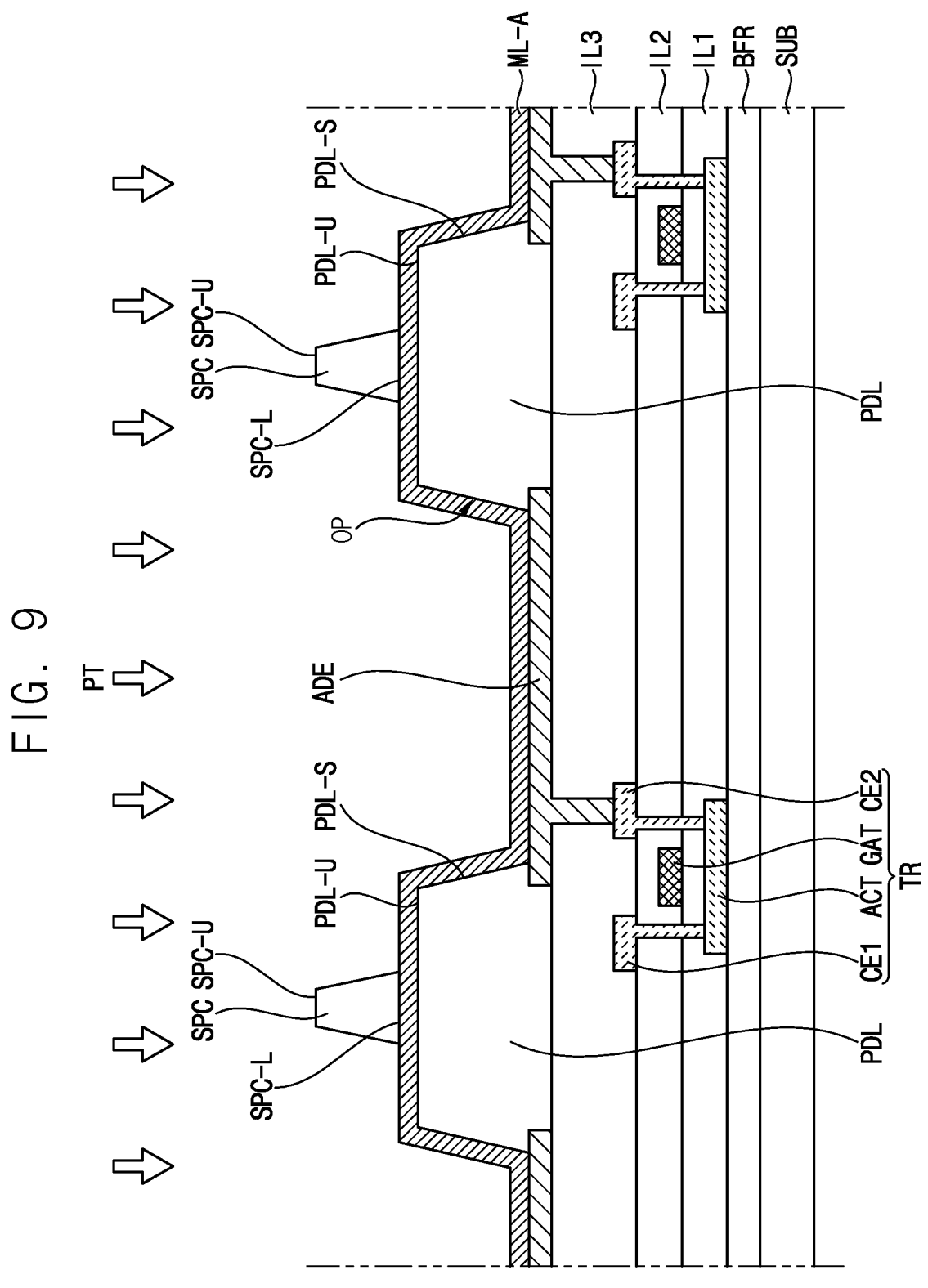
Figure 10:
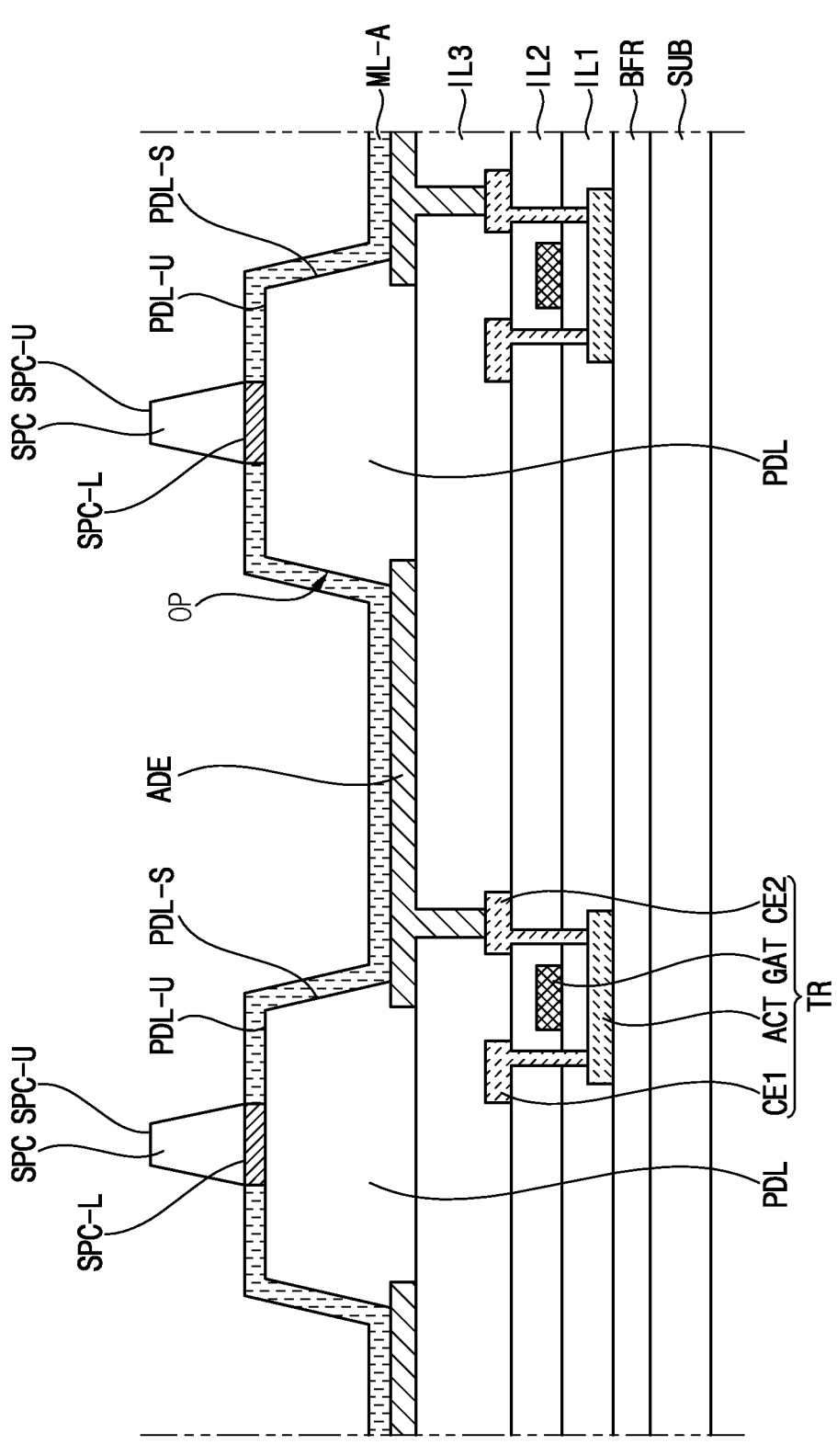

Referring to FIGS. 9 and 10, the portion of the preliminary metal layer ML-A which is exposed from the spacer SPC may be oxidized. For example, an oxygen atmosphere may be created on the preliminary metal layer ML-A, and then the portion of the preliminary metal layer ML-A which is exposed from the spacer SPC may be exposed to oxygen ($O_2$) gas. Accordingly, the metal material included in the portion of the preliminary metal layer ML-A which is exposed from the spacer SPC may react with oxygen (O2) gas. Accordingly, the portion of the preliminary metal layer ML-A which is exposed from the spacer SPC may be oxidized. For example, the preliminary metal layer ML-A may include molybdenum (Mo) and the portion of the preliminary metal layer ML-A which is exposed from the spacer SPC may be oxidized to form molybdenum oxide (MoOx)

Even under an oxygen atmosphere, the portion of the preliminary metal layer ML-A covered by the spacer SPC may not be exposed to oxygen (O2) gas. Accordingly, the metal material included in the portion of the preliminary metal layer ML-A which is covered by the spacer SPC may not react with oxygen (O2) gas. Accordingly, the portion of the preliminary metal layer ML-A which is covered by the spacer SPC may not be oxidized. In other words, an area of the preliminary metal layer ML-A corresponding to the spacer SPC may not be oxidized, and only an area not corresponding to the spacer SPC may be selectively oxidized. As used herein, the area may be a planar area extended along the plane defined by the first direction D1 and the second direction D2 crossing each other.

In an embodiment, plasma treatment PT may be performed using oxygen (O2) gas to oxidize the preliminary metal layer ML-A. Plasma treatment (PT) may be performed on the preliminary metal layer ML-A and on the spacer SPC. The portion of the preliminary metal layer ML-A which is exposed from the spacer SPC may be oxidized through the plasma treatment PT. A portion of the preliminary metal layer ML-A which is exposed from the spacer SPC may not be oxidized through the plasma treatment PT, such as to define an un-oxidized portion of the preliminary metal layer ML-A.

In an embodiment, in the process of oxidizing the portion of the preliminary metal layer ML-A which is exposed from the spacer SPC, the spacer SPC may also be exposed to oxygen (O2) gas. Accordingly, in the process of oxidizing the portion of the preliminary metal layer ML-A which is exposed from the spacer SPC, a content of the oxygen atoms included in the spacer SPC may change during oxidation of the portion of the preliminary metal layer ML-A.

For example, after oxidizing the portion of the preliminary metal layer ML-A which is exposed from the spacer SPC, the oxygen in a region adjacent to the top surface SPC-U of the spacer SPC may be altered. A content of oxygen atoms in an area of the spacer SPC which is adjacent to the upper surface SPC-U of the spacer SPC may be greater than a content of oxygen atoms in an area of the spacer SPC which is adjacent to the lower surface SPC-L of the spacer SPC.

In other words, in the process of oxidizing the portion of the preliminary metal layer ML-A which is exposed from the spacer SPC, the area of the spacer SPC which is adjacent to the upper surface SPC-U of the spacer SPC may be more exposed to the oxygen atmosphere than the area of the spacer SPC which is adjacent to the lower surface SPC-L of the spacer SPC. Accordingly, a content of the oxygen atoms of the spacer SPC may be increased in the area of the spacer SPC which is adjacent to the upper surface SPC-U of the spacer SPC by oxygen (O2) gas. Therefore, after oxidizing the portion of the preliminary metal layer ML-A which is exposed from the spacer SPC, a content of oxygen atoms included in the spacer SPC may be partially non-uniform. In other words, the oxygen atoms included in the spacer SPC may be more densely distributed in the area of the spacer SPC which is adjacent to the upper surface SPC-U of the spacer SPC. In an embodiment, a content of the oxygen atoms of the spacer SPC may increase in a direction away from the metal layer ML, along the thickness direction.

Figure 11:
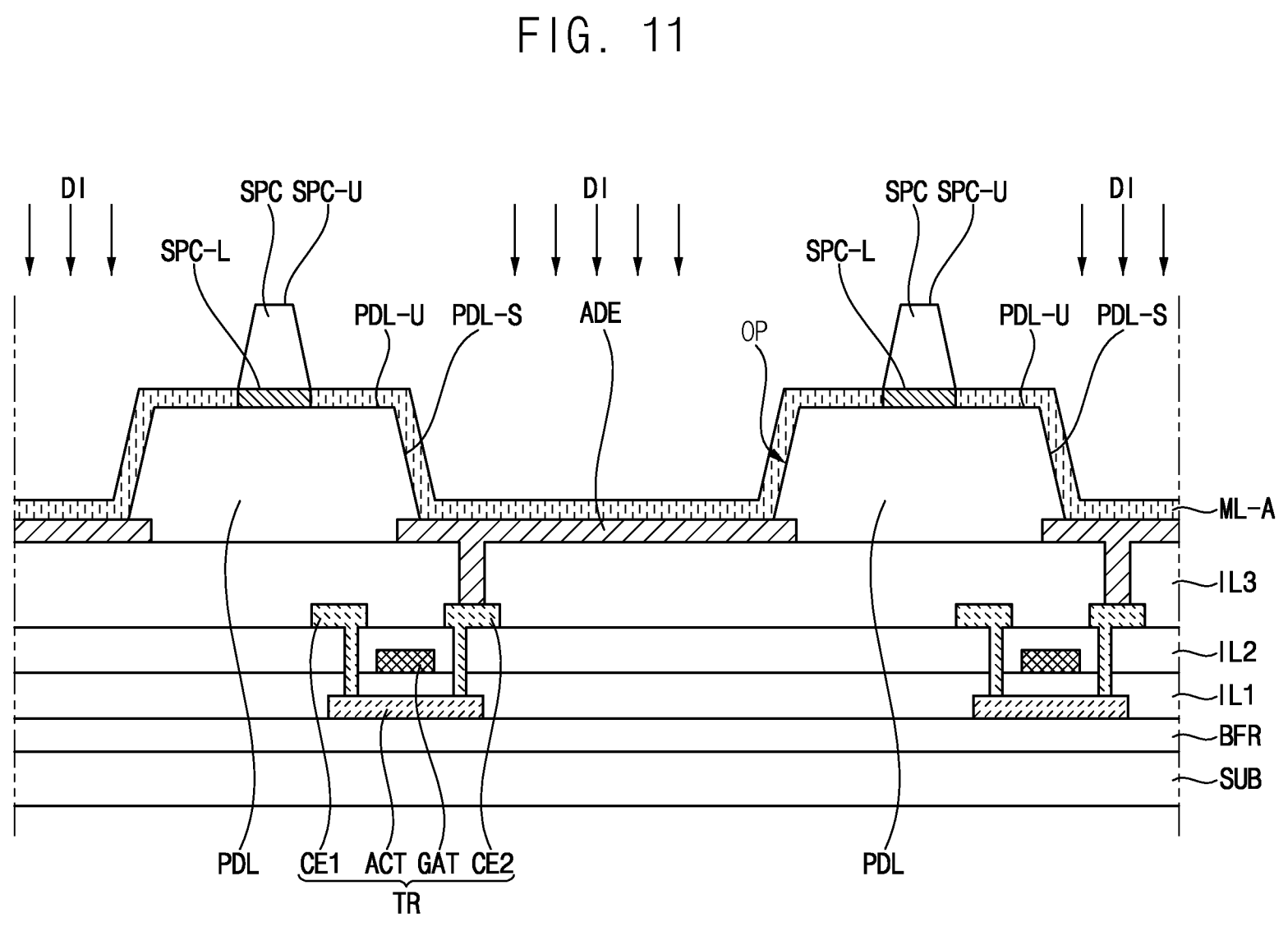
Figure 12:
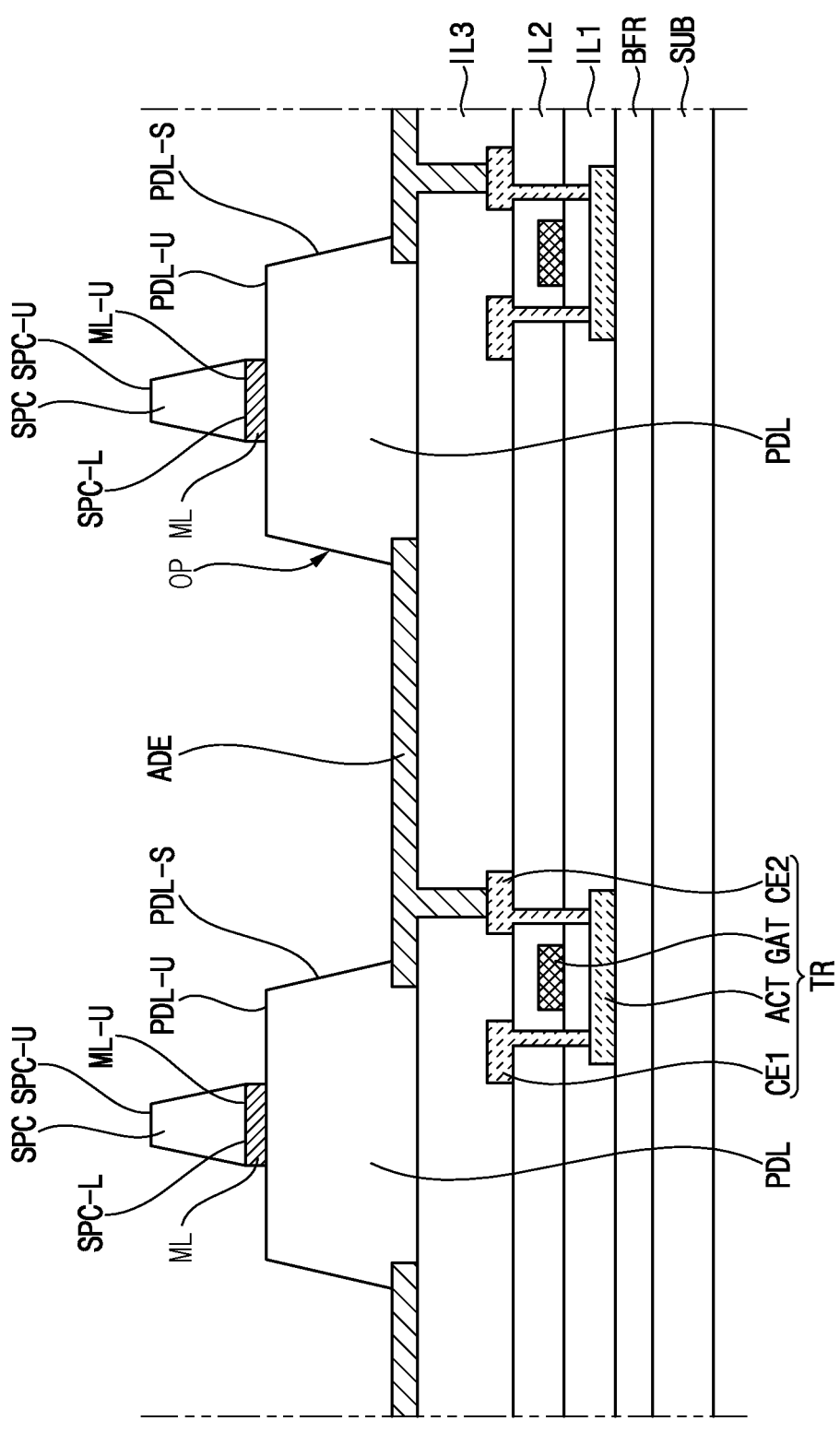

Referring to FIGS. 11 and 12, the metal layer ML may be formed by removing an oxidized portion of the preliminary metal layer ML-A which corresponds to portions of the preliminary metal layer ML-A which extend further than the spacer SPC to be disposed outside of the spacer SPC in the plan view. In an embodiment, the removal of the oxidized portion of the preliminary metal layer ML-A may be performed through dissolution using distilled water DI. As described above, since the preliminary metal layer ML-A is formed of the metal material soluble in water when oxidized, the oxidized portion of the preliminary metal layer ML-A may be selectively removed using distilled water DI.

Accordingly, a non-oxidized portion and a remaining portion of the preliminary metal layer ML-A may together form the metal layer ML. The metal layer ML may include a same material as the preliminary metal layer ML-A. For example, the metal layer ML may include molybdenum (Mo).

In an embodiment, since the portion of the preliminary metal layer ML-A which is covered by the spacer SPC may remain as the non-oxidized portion, a solid portion of the metal layer ML may be formed to correspond to the spacer SPC. For example, the solid portion of the metal layer ML may be formed under the spacer SPC. In other words, the metal layer ML may be disposed between the pixel defining layer PDL and the spacer SPC. Accordingly, the spacer SPC may be spaced apart from the upper surface PDL-U of the pixel defining layer PDL by the metal layer ML.

In an embodiment, the metal layer ML may be formed to partially cover the upper surface PDL-U of the pixel defining layer PDL. In other words, the metal layer ML may cover a portion of the upper surface PDL-U of the pixel defining layer PDL, and expose a portion of the upper surface PDL-U of the pixel defining layer PDL together with the side surface PDL-S of the pixel defining layer PDL. In this case, the upper surface ML-U of the metal layer ML may be entirely covered by the spacer SPC. The upper surface ML-U of the metal layer ML may meet the lower surface SPC-L of the solid portion of the pixel defining layer PDL and form an interface therebetween.

Figure 13:
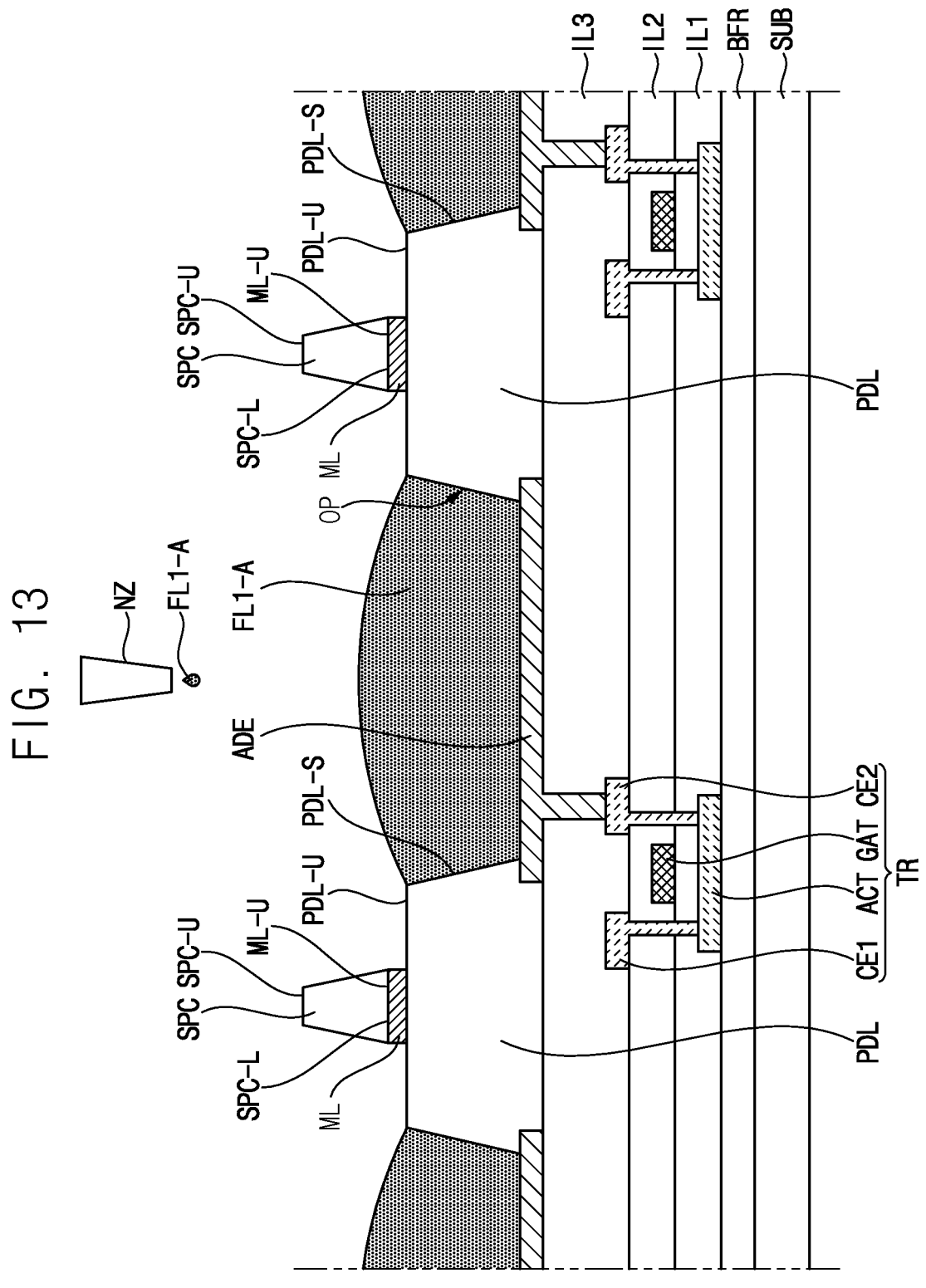
Figure 14:
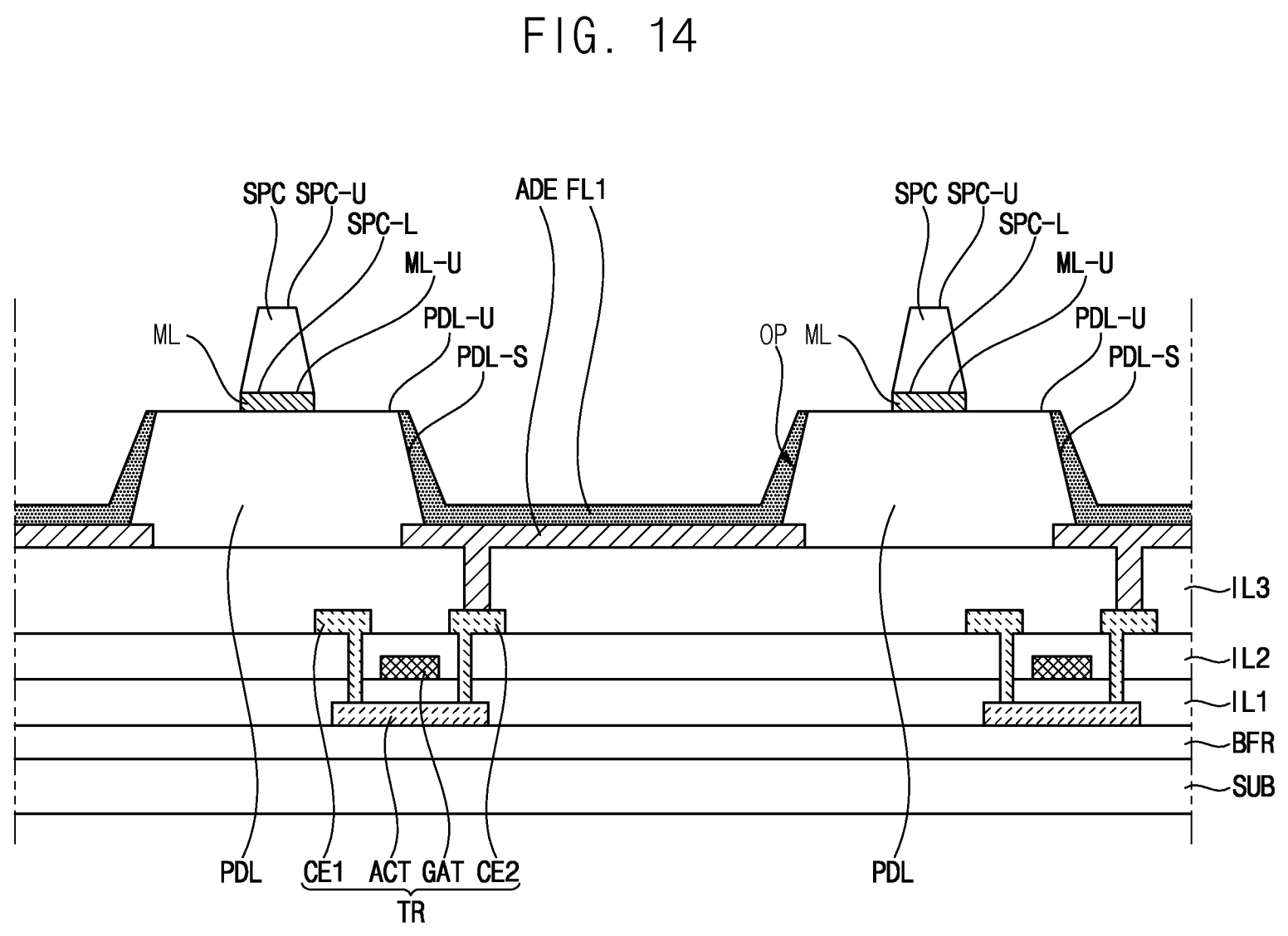

Referring to FIGS. 13 and 14, the first functional layer FL1 may be formed on the pixel electrode ADE. The first functional layer FL1 may be formed to overlap the opening OP of the pixel defining layer PDL. For example, the first functional layer FL1 may be disposed within the opening OP of the pixel defining layer PDL.

In an embodiment, the first functional layer FL1 may be formed using an inkjet printing method. An example of a process of forming the first functional layer FL1 using the inkjet printing method will be briefly described as follows. First, as shown in FIG. 13, a composition for forming the preliminary first functional layer FL1-A from which the first functional layer FL1 is formed, may be provided to the opening OP of the pixel defining layer PDL by using the inkjet printing method. For example, the composition for forming the preliminary first functional layer FL1-A may be applied to the opening OP of the pixel defining layer PDL through a nozzle NZ of an inkjet printing apparatus.

In an embodiment, when the upper surface PDL-U of the pixel defining layer PDL has liquid repellency, a phenomenon in which the composition for forming the preliminary first functional layer FL1-A overflows to the upper surface PDL-U of the pixel defining layer PDL may be minimized or prevented.

In an embodiment, the composition for forming the preliminary first functional layer FL1-A may include an organic solvent and a functional material. The functional material may be a material for forming the first functional layer FL1. For example, the functional material may be a hole transport material. As long as the organic solvent dissolves the functional material, the type is not limited.

Thereafter, as shown in FIG. 14, the first functional layer FL1 may be formed by drying and/or heat-treating the composition for forming the preliminary first functional layer FL1-A. For example, the first functional layer FL1 may be formed by removing the organic solvent through drying and/or heat treatment.

The above-described process of forming the first functional layer FL1 is only an example and may be variously changed.

Figure 15:
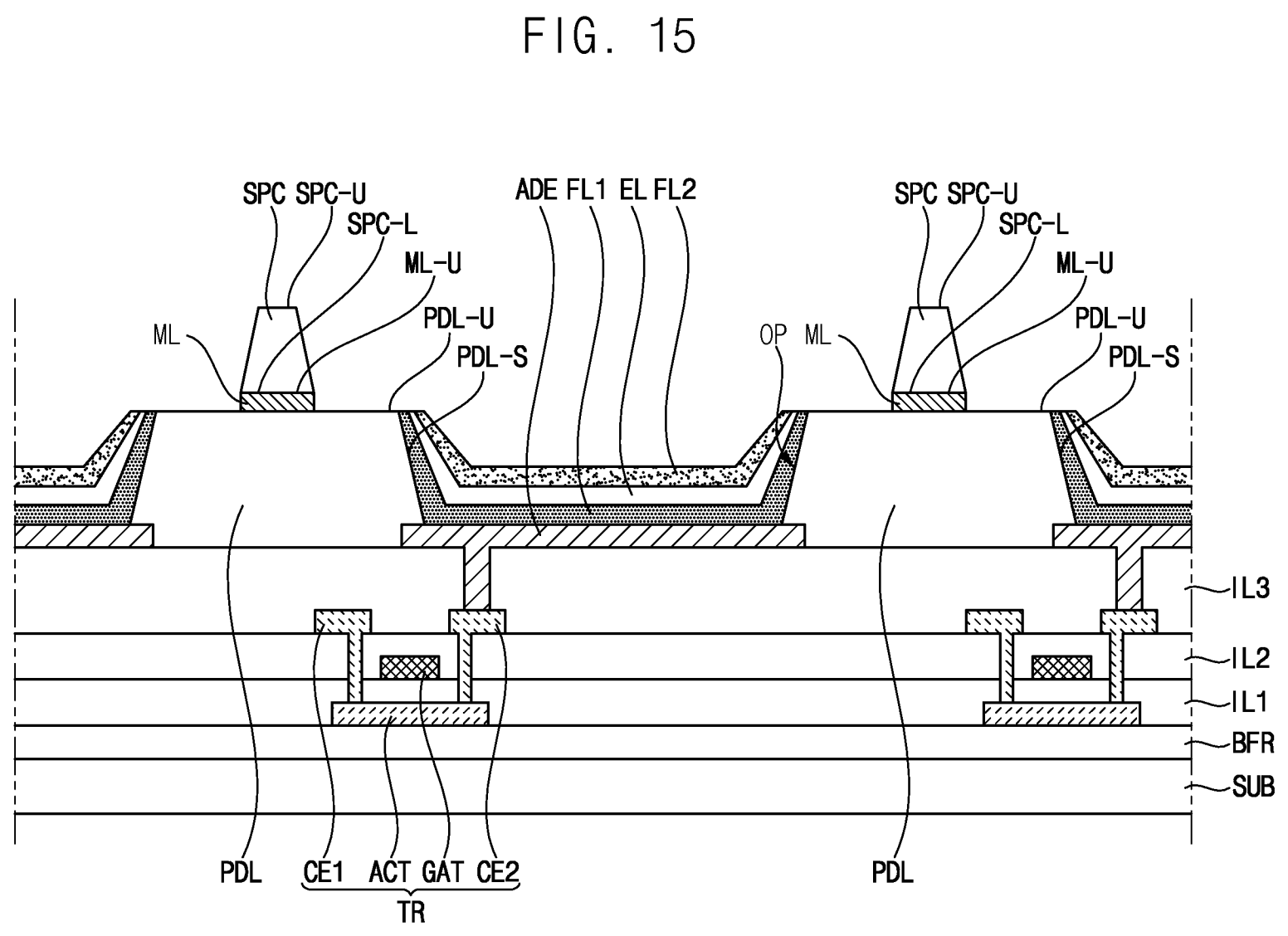

Referring to FIG. 15, the light emitting layer EL may be formed on the first functional layer FL1, and the second functional layer FL2 may be formed on the light emitting layer EL. The light emitting layer EL and the second functional layer FL2 may be formed to overlap the opening OP of the pixel defining layer PDL. For example, the light emitting layer EL and the second functional layer FL2 may be disposed within the opening OP of the pixel defining layer PDL.

In an embodiment, the light emitting layer EL and the second functional layer FL2 may be formed using an inkjet printing method. Process of forming each of the light emitting layer EL and the second functional layer FL2 using the inkjet printing method may be substantially the same as the process of forming the first functional layer FL1 described above with reference to FIG. 14 except for the type of material (e.g., the functional material) provided to the opening OP by the inkjet printing apparatus.

For example, in the process of forming the light emitting layer EL, the functional material may be an organic light emitting material or a quantum dot material. Also, in the process of forming the second functional layer FL2, the functional material may be an electron transport material.

With reference to FIGS. 13 to 15, it has been described that the first functional layer FL1, the light emitting layer EL, and the second functional layer FL2 are all formed using the inkjet printing method, but the invention is not necessarily limited thereto. In another embodiment, one or two of the first functional layer FL1, the light emitting layer EL, and the second functional layer FL2 may be formed using the inkjet printing method, and the other one or two may be formed using a vacuum deposition method, an anisotropic deposition method, or the like. For example, the first functional layer FL1 and the light emitting layer EL may be formed using the inkjet printing method, and the second functional layer FL2 may be formed using the anisotropic deposition method.

After the first functional layer FL1, the light emitting layer EL, and the second functional layer FL2 are all formed, referring back to FIG. 3, the common electrode CTE may be formed to cover the second functional layer FL2, the pixel defining layer PDL, the metal layer ML, and the spacer SPC. Accordingly, the light emitting device LED including the pixel electrode ADE, the first functional layer FL1, the light emitting layer EL, the second functional layer FL2 and the common electrode CTE may be formed on the substrate SUB. In an embodiment, the common electrode CTE may be formed to continuously extend over the plurality of pixels PX. In an embodiment, the common electrode CTE may be formed of a metal, an alloy, a conductive metal nitride, a conductive metal oxide, a transparent conductive material, or the like. The stacked structure including the substrate SUB and the various layers up to and including the common electrode CTE may together define a display substrate and/or display panel of the display device 10, without being limited thereto.

Figure 16:
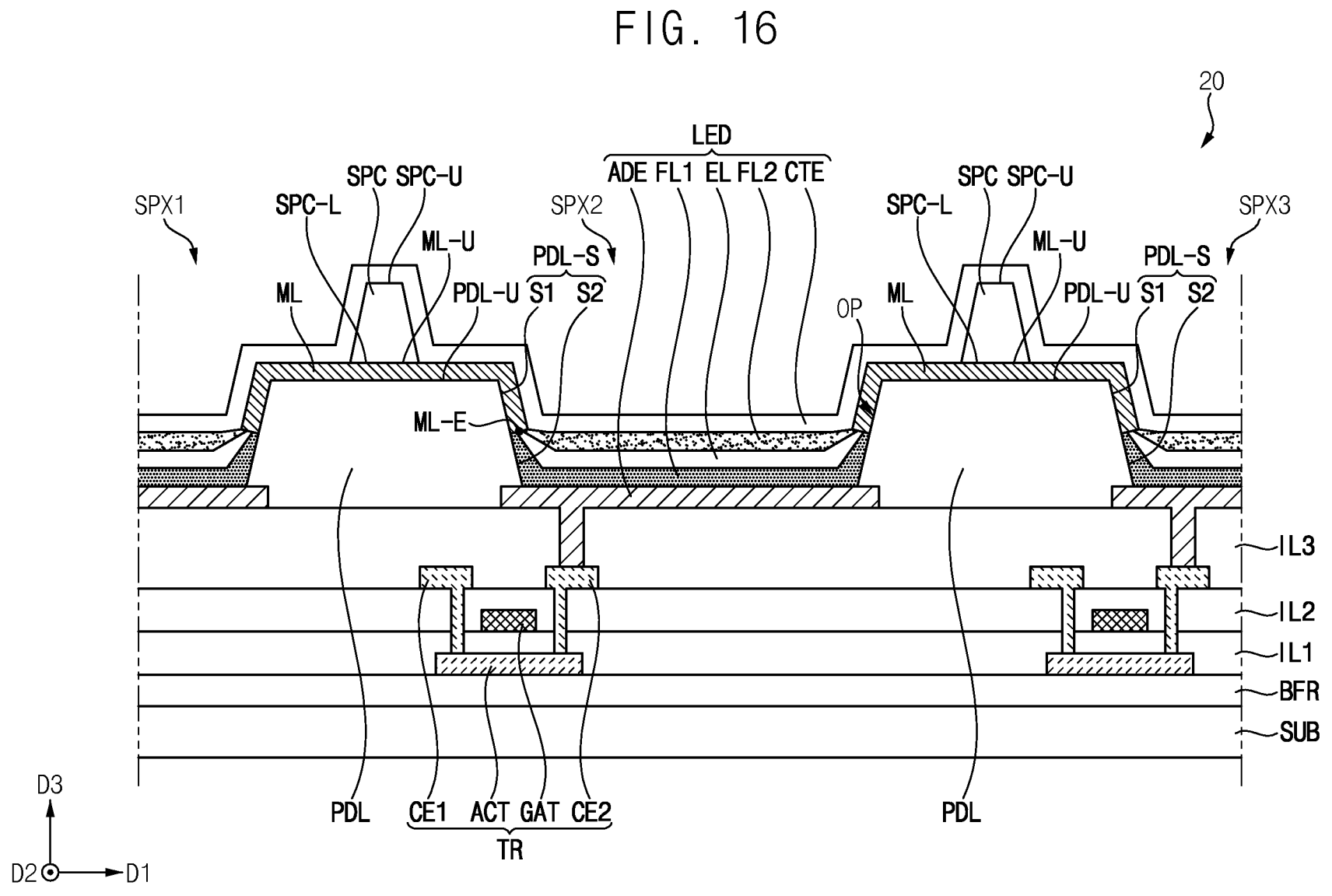

FIG. 16 is a cross-sectional view illustrating a display device 20 according to another embodiment. For example, FIG. 16 may correspond to the cross-sectional view of FIG. 3, that is, along line I-I' in FIG. 2.

Referring to FIG. 16, the display device 20 according to another embodiment may be substantially the same as or similar to the display device 10 described with reference to FIG. 3 except for a disposition structure of the metal layer ML, the first functional layer FL1, the light emitting layer EL, and the second functional layer FL2. Accordingly, repeated descriptions will be omitted or simplified.

In an embodiment, the metal layer ML may be disposed on the upper surface PDL-U and on a portion of the side surface PDL-S of the pixel defining layer PDL. The metal layer ML may cover the upper surface PDL-U of the pixel defining layer PDL. The metal layer ML may extend from the upper surface PDL-U of the pixel defining layer PDL and along the side surface PDL-S of the pixel defining layer PDL. In this case, the metal layer ML may partially overlap the spacer SPC. In other words, a portion of the metal layer ML may be covered by the spacer SPC, and a remaining portion of the metal layer ML may be uncovered to be exposed from the spacer SPC.

The side surface PDL-S of the pixel defining layer PDL may include a first surface S1 and a second surface S2. The first surface S1 may be a surface extended from the upper surface PDL-U of the pixel defining layer PDL. The second surface S2 may be a surface extending from the first surface S1 and in a direction toward the pixel electrode ADE. That is, the first surface S1 may connect the upper surface PDL-U and the second surface S2 to each other. The metal layer ML may overlap or correspond to the first surface S1. The metal layer ML may be spaced apart from the second surface S2, in a direction along the first surface S1. In other words, an end of the metal layer ML may be spaced apart from the pixel electrode ADE, along the thickness direction.

The first surface S1 and the second surface S2 may be distinguished from each other based on an edge ML-E of the metal layer ML which defines the end thereof. The edge ML-E of the metal layer ML may be a surface of the metal layer ML which is closest to the substrate SUB. The first surface S1 may be a side surface of the pixel defining layer PDL extended from the upper surface PDL-U of the pixel defining layer PDL to the edge ML-E of the metal layer ML. The second surface S2 may be a side surface of the pixel defining layer PDL extending from the edge ML-E of the metal layer ML to the pixel electrode ADE. The second surface S2 may be exposed to outside the metal layer ML at a position between the pixel electrode ADE and the metal layer ML.

In an embodiment, the second surface S2 may overlap at least a portion of each of the first functional layer FL1, the light emitting layer EL, and the second functional layer FL2. The second surface S2 may be coplanar with a portion of each of the first functional layer FL1, the light emitting layer EL, and the second functional layer FL2. In this case, the metal layer ML may be disposed on the first surface S1, and the first functional layer FL1, the light emitting layer EL and the second functional layer FL2 may be disposed on the second surface S2.

In an embodiment, the metal layer ML may adjust a position of each edge of the first functional layer FL1, the light emitting layer EL, and the second functional layer FL2. The respective edges of the first functional layer FL1, the light emitting layer EL, and the second functional layer FL2 may be a surface of each of the first functional layer FL1, the light emitting layer EL, and the second functional layer FL2 that is farthest from the substrate SUB. For example, the edge of each of the first functional layer FL1, the light emitting layer EL, and the second functional layer FL2 may be disposed to contact the edge ML-E of the metal layer ML. As being in contact or meeting, elements may form an interface therebetween.

Accordingly, the position of each of the first functional layer FL1, the light emitting layer EL, and the second functional layer FL2 may be determined by the position of the edge ML-E of the metal layer ML. In other words, the metal layer ML may adjust a position of the upper edge of each of the first functional layer FL1, the light emitting layer EL, and the second functional layer FL2 along the side surfaces PDL-S of the pixel defining layer PDL. Accordingly, when the metal layer ML is disposed on the upper surface PDL-U and the portion of the side surface PDL-S of the pixel defining layer PDL, the edge ML-E of the metal layer ML may function as a pinning point (or a reference point) in a process of forming each of the first functional layer FL1, the light emitting layer EL, and the second functional layer FL2. Accordingly, thickness and/or shape of each of the first functional layer FL1, the light emitting layer EL, and the second functional layer FL2 may be maintained constant. Accordingly, reliability of the stacked structure of the display device 20 may be further improved.

In FIG. 16, it is illustrated that the metal layer ML extends in opposite direction to opposing side surfaces of the pixel defining layer PDL which are each connected to the upper surface PDL-U of the pixel defining layer PDL, but the invention is not necessarily limited thereto. For example, in another embodiment, the metal layer ML may extend only to one side surface among the opposing side surfaces of the pixel defining layer PDL and may not extend to the other side surface. That is, a same solid portion of the pixel defining layer PDL may include a first side surface PDL-S and a second side surface PDL-S which oppose each other with the upper surface PDL-U therebetween, to define the opposing side surfaces.

FIGS. 17 to 26 are cross-sectional views illustrating a method of manufacturing (or providing) the display device 20 of FIG. 16. For example, FIGS. 17 to 26 may be cross-sectional views illustrating a method of providing the display device 20 according to another embodiment. Hereinafter, the method of manufacturing the display device 20 will be described, focusing on differences from the method of manufacturing the display device 10 described with reference to FIGS. 4 to 15.

Figure 17:
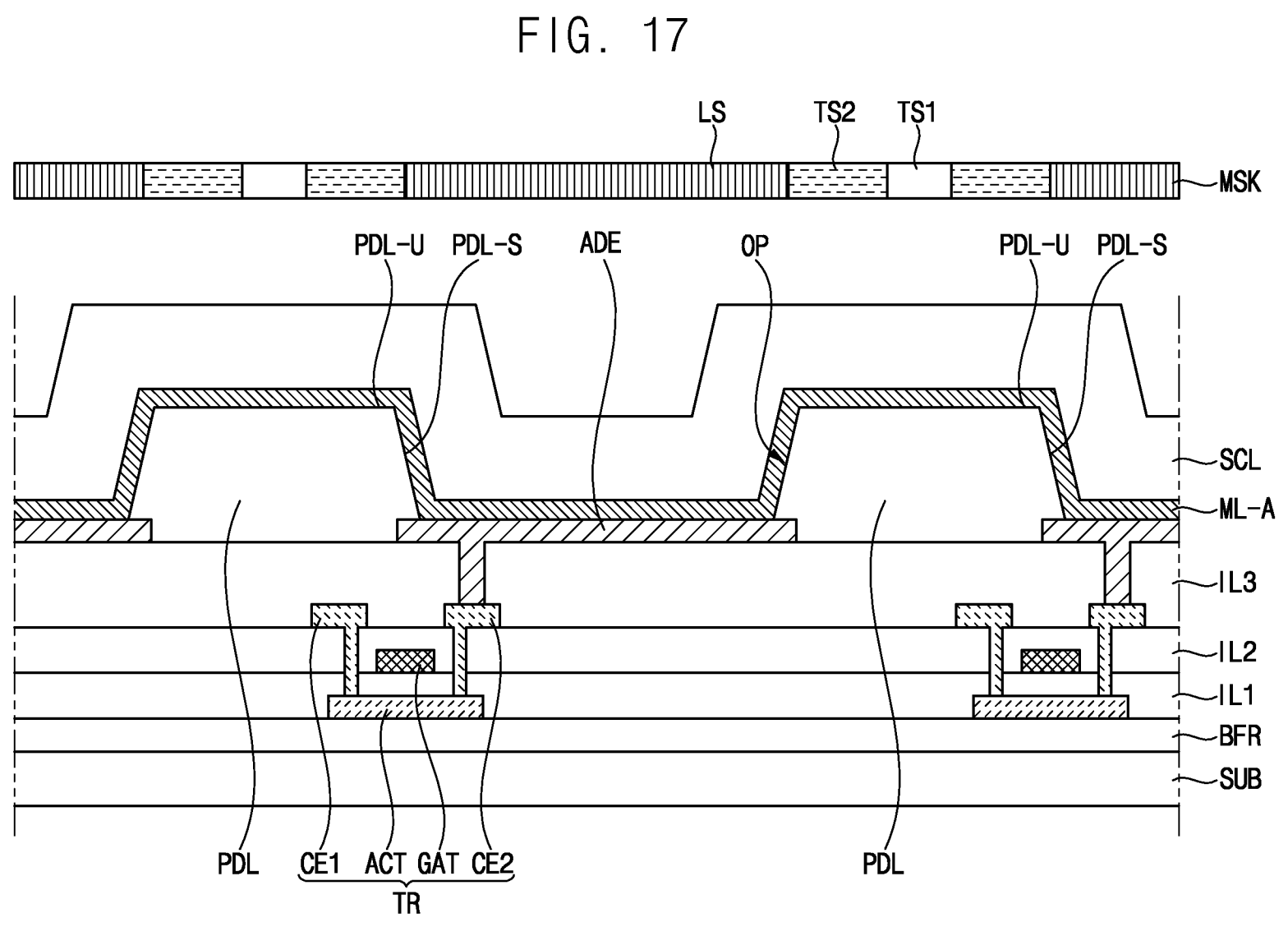
Figure 18:
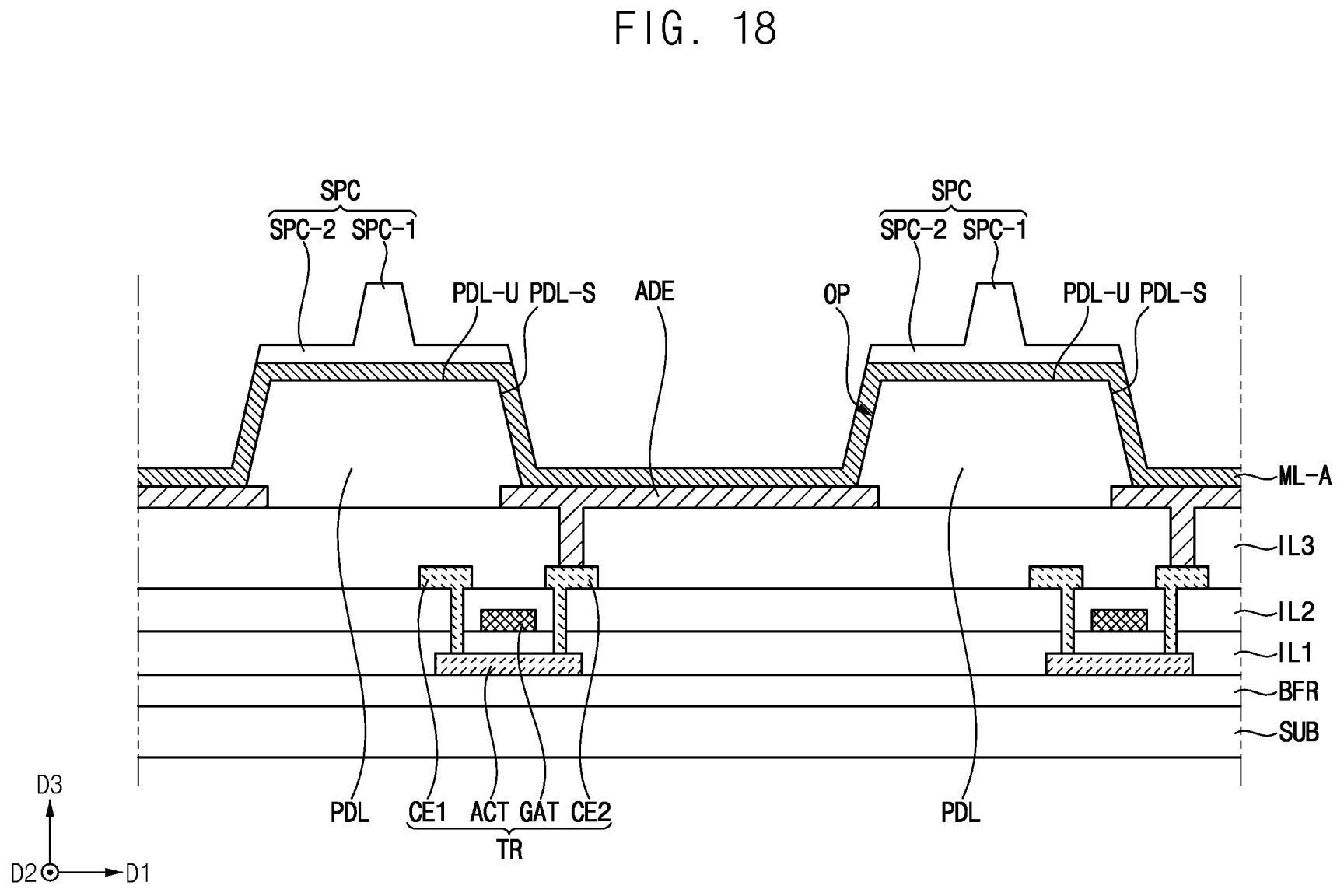

Referring to FIGS. 17 and 18, in the manufacturing method of the display device according to another embodiment, the mask MSK used to expose and develop the spacer composition layer SCL may include a light blocking part LS, a first light transmitting part TS1 and a second light transmitting part TS2.

The light blocking part LS may be an area blocking incident light incident on the mask MSK. The first light transmitting part TS1 and the second light transmitting part TS21 may be areas through which the incident light is transmitted and together define a light transmitting area of the mask MSK.

In an embodiment, the first light transmitting part TS1 may have a first light transmittance, and the second light transmitting part TS2 may have a second light transmittance lower than the first light transmittance. For example, the first light transmitting part TS1 may transmit substantially an entirety of the incident light, and the second light transmitting part TS2 may transmit only a portion of the incident light.

Accordingly, the incident light may not be irradiated to an area of the spacer composition layer SCL corresponding to the light blocking part LS. In addition, most of the incident light may be irradiated to an area of the spacer composition layer SCL corresponding to the first light transmitting part TS1. In addition, only a portion of the incident light may be irradiated to an area of the spacer composition layer SCL corresponding to the second light transmitting part TS2.

When the spacer composition layer SCL is developed, most of the spacer composition layer SCL corresponding to the light blocking part LS may be removed, most of the spacer composition layer SCL corresponding to the first light transmitting part TS1 may remain, and a portion of the spacer composition layer SCL corresponding to the second light transmitting part TS2 may be removed. Accordingly, as shown in FIG. 18, the spacer SPC including a first part SPC-1 (e.g., a first spacer portion or a first thickness portion) and a second part SPC-2 (e.g., a second spacer portion or a second thickness portion) having different thicknesses each other may be formed.

The first part SPC-1 may correspond to the first light transmitting part TS1 of the mask MSK, and the second part SPC-2 may correspond to the second light transmitting part TS2 of the mask MSK. The first part SPC-1 may have a first thickness, and the second part SPC-2 may have a second thickness smaller than the first thickness.

Figure 19:
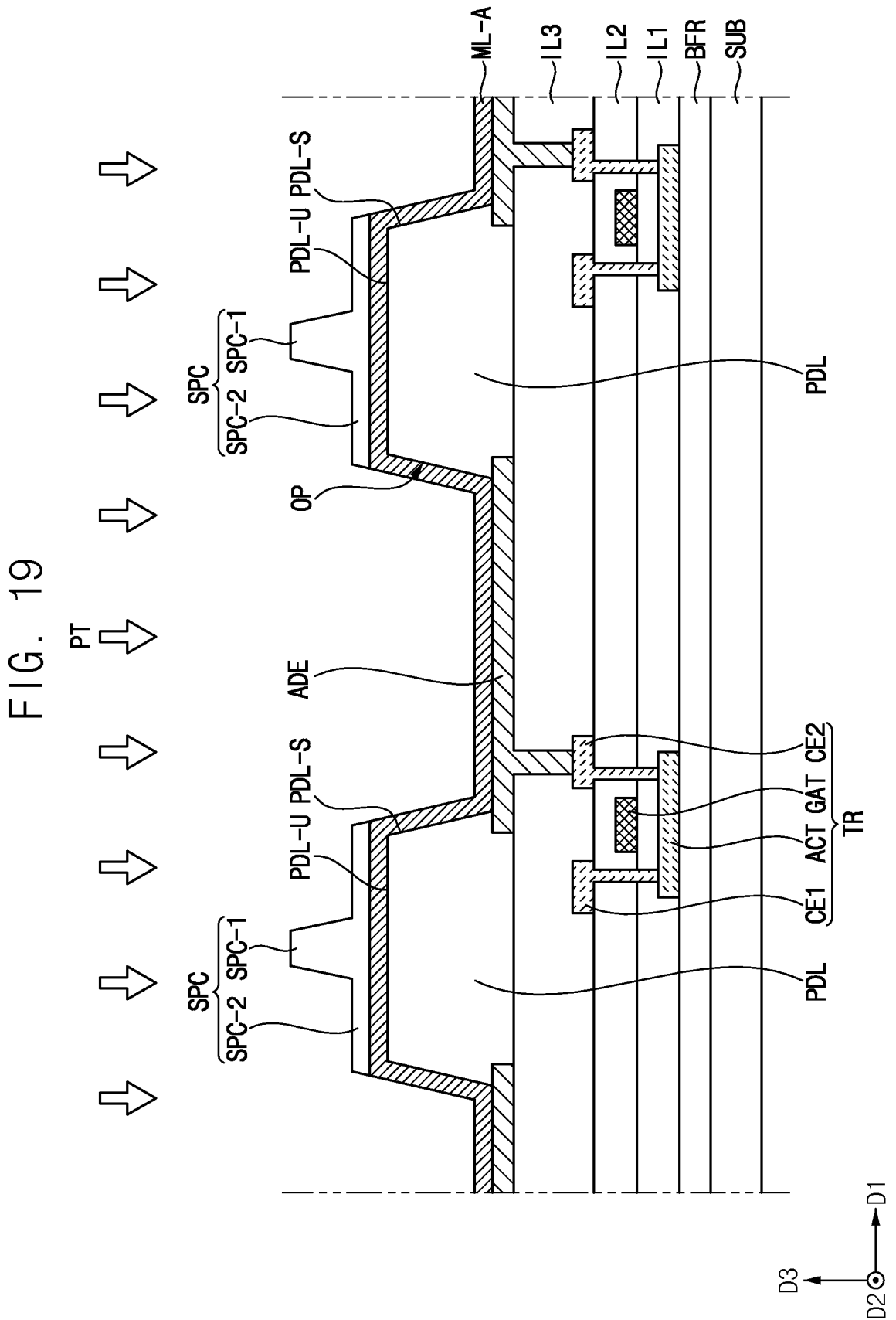
Figure 20:
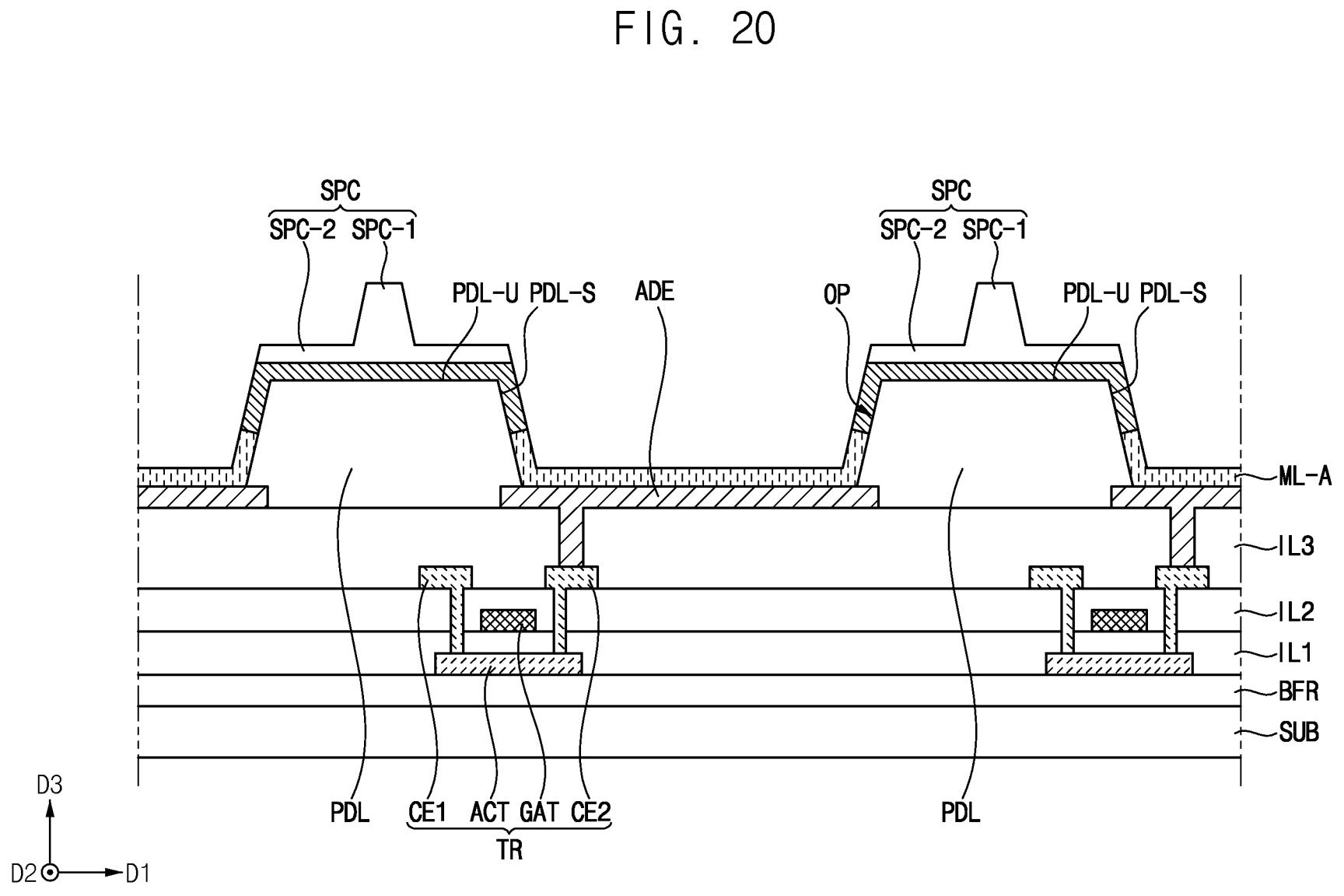

Referring to FIGS. 19 and 20, a portion of the preliminary metal layer ML-A exposed from the spacer SPC may be oxidized. A process of oxidizing the preliminary metal layer ML-A may be substantially the same as the process described above with reference to FIG. 10.

However, according to the manufacturing method of the display device 20 according to another embodiment, a portion of the preliminary metal layer ML-A overlapping the upper surface PDL-U of the pixel defining layer PDL may not be exposed to oxygen (O2) gas entirely by the spacer SPC. In addition, the portion of the preliminary metal layer ML-A overlapping the side surface PDL-S of the pixel defining layer PDL may also not be exposed oxygen (O2) gas entirely by the spacer SPC. Accordingly, as shown in FIG. 20, the portion of the preliminary metal layer ML-A overlapping the upper surface PDL-U of the pixel defining layer PDL and the side surface PDL-S of the pixel defining layer PDL may not be oxidized, and only the remaining portion may be selectively oxidized.

In other words, a boundary between a non-oxidized portion of the preliminary metal layer ML-A and an oxidized portion of the preliminary metal layer ML-A may be formed at a point where the preliminary metal layer ML-A and the side surface PDL-S of the pixel defining layer PDL overlap. In an embodiment, a position of the boundary may be determined by a length of the second part SPC-2 of the spacer SPC, where the length is defined in a planar direction along the substrate SUB. In other words, the position of the boundary may be determined by a position of the end or edge of the second part SPC-2 of the spacer SPC. An end of the spacer SPC may correspond to a position which is furthest from a center of the spacer SPC (or from the first part SPC-1 of the spacer SPC).

Figure 21:
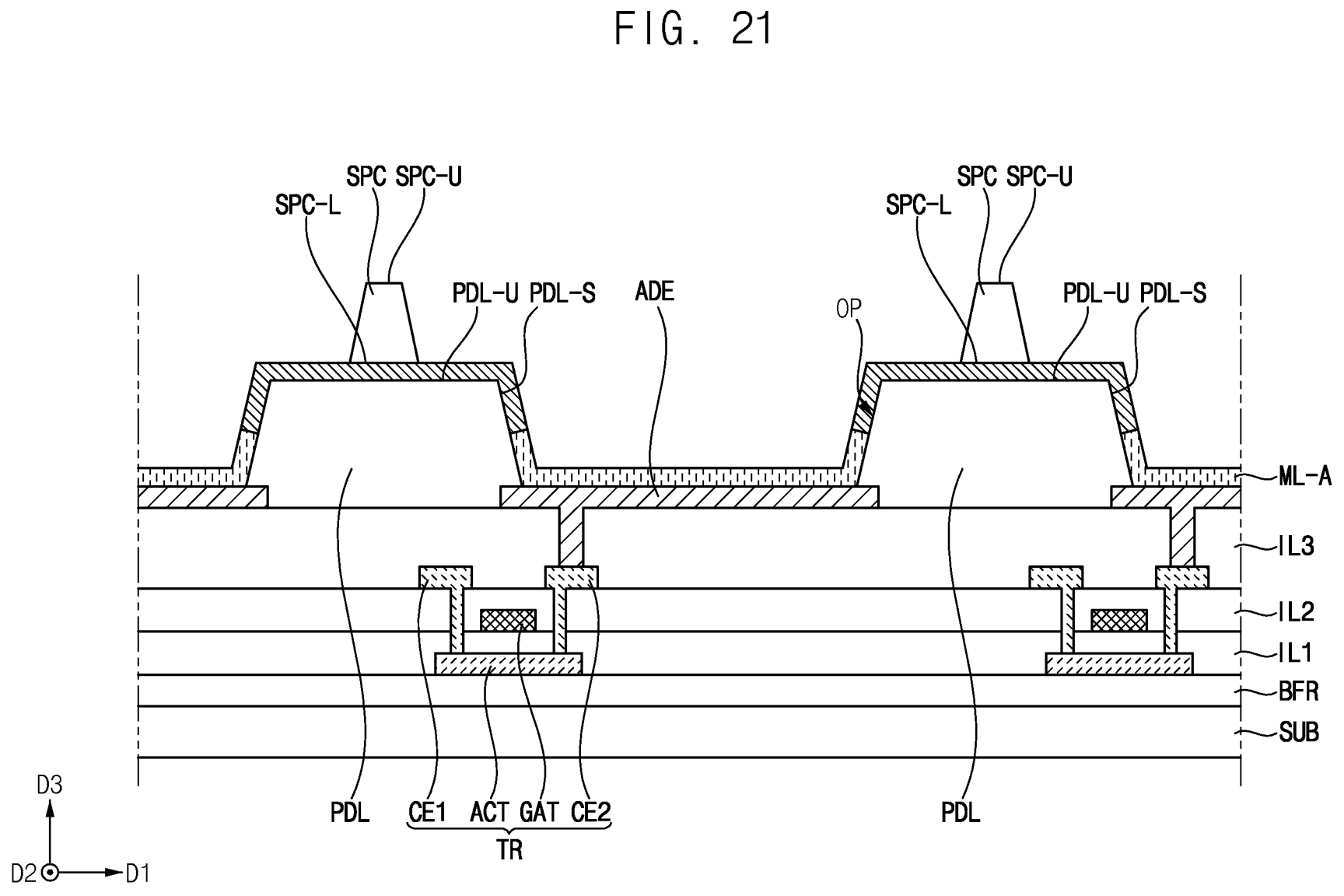

Referring further to FIG. 21, after the portion of the preliminary metal layer ML-A exposed from the spacer SPC is oxidized, the second part SPC-2 of the spacer SPC may be removed. In an embodiment, the second part SPC-2 of the spacer SPC may be removed through an additional developing process. However, the invention is not necessarily limited thereto, and in another embodiment, the second part SPC-2 of the spacer SPC may be removed through a separate etching process. When the second part SPC-2 of the spacer SPC is removed, the first part SPC-1 of the spacer SPC itself may function as the spacer SPC of the display device 20.

Figure 22:
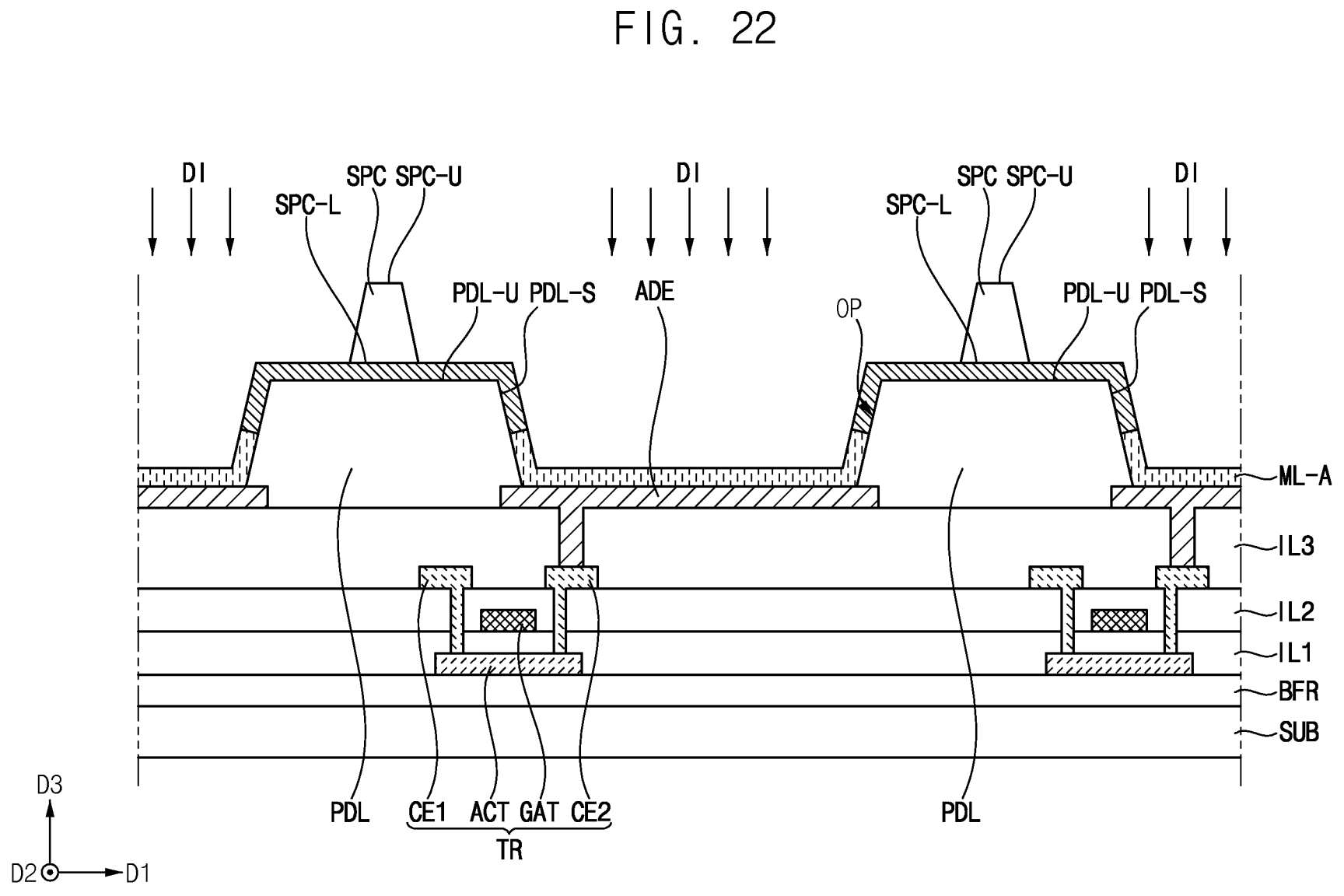
Figure 23:
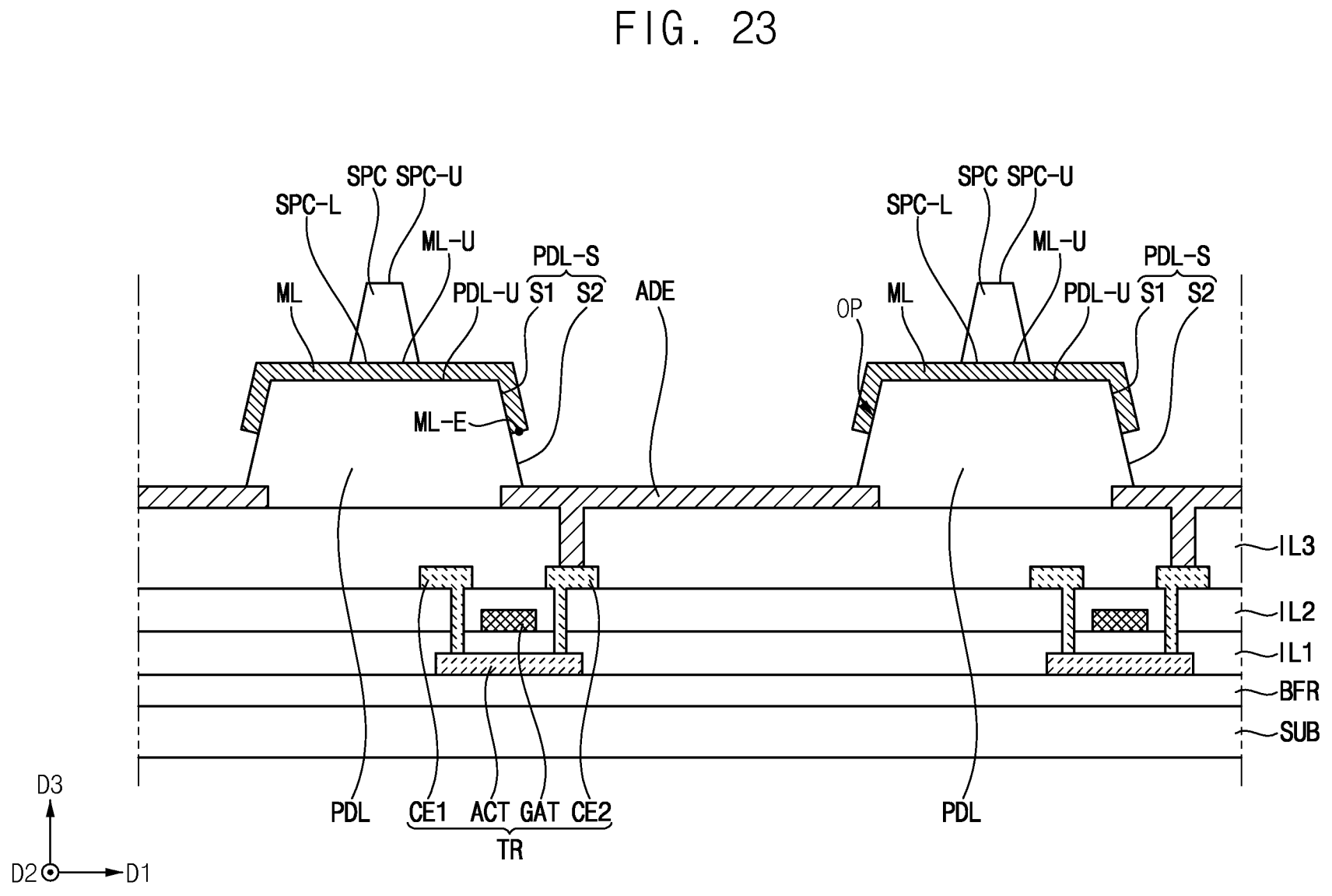

Referring to FIGS. 22 and 23, the metal layer ML may be formed by removing the oxidized portion of the preliminary metal layer ML-A. A process of removing the oxidized portion of the preliminary metal layer ML-A may be substantially the same as the process described above with reference to FIGS. 11 and 12.

However, according to the manufacturing method of the display device 20 according to another embodiment, the metal layer ML may be formed to be disposed on the upper surface PDL-U and extend along a portion of the side surface PDL-S of the pixel defining layer PDL which meets the upper surface PDL-U. The metal layer ML may cover the upper surface PDL-U of the pixel defining layer PDL. The metal layer ML may extend from the upper surface PDL-U of the pixel defining layer PDL to the side surface PDL-S of the pixel defining layer PDL and along a portion of the side surface PDL-S. In this case, the metal layer ML may partially overlap the spacer SPC. In other words, a portion of the metal layer ML may be covered by the spacer SPC, and the remaining portion of the metal layer ML may be exposed from the spacer SPC.

Accordingly, the side surface PDL-S of the pixel defining layer PDL may be divided into the first surface S1 as a first surface portion and the second surface S2 as a second surface portion. The first surface S1 and the second surface S2 may be defined or distinguished from each other based on the edge ML-E (or the distal end) of the metal layer ML. The edge ML-E of the metal layer ML may substantially correspond to the boundary between the non-oxidized portion of the preliminary metal layer ML-A and the oxidized portion of the preliminary metal layer ML-A (refer to FIG. 22) and/or to the end of the spacer SPC which is defined by the second part SPC-2 (refer to FIG. 20).

The first surface S1 may be the side surface portion of the pixel defining layer PDL extended from the upper surface PDL-U of the pixel defining layer PDL and terminating at the edge ML-E of the metal layer ML. The second surface S2 may be the side surface of the pixel defining layer PDL extending from a position of the edge ML-E of the metal layer ML to the pixel electrode ADE. An exposed portion of the second surface S2 may be defined between the pixel electrode ADE and the edge ML-E of the metal layer ML.

Figure 24:
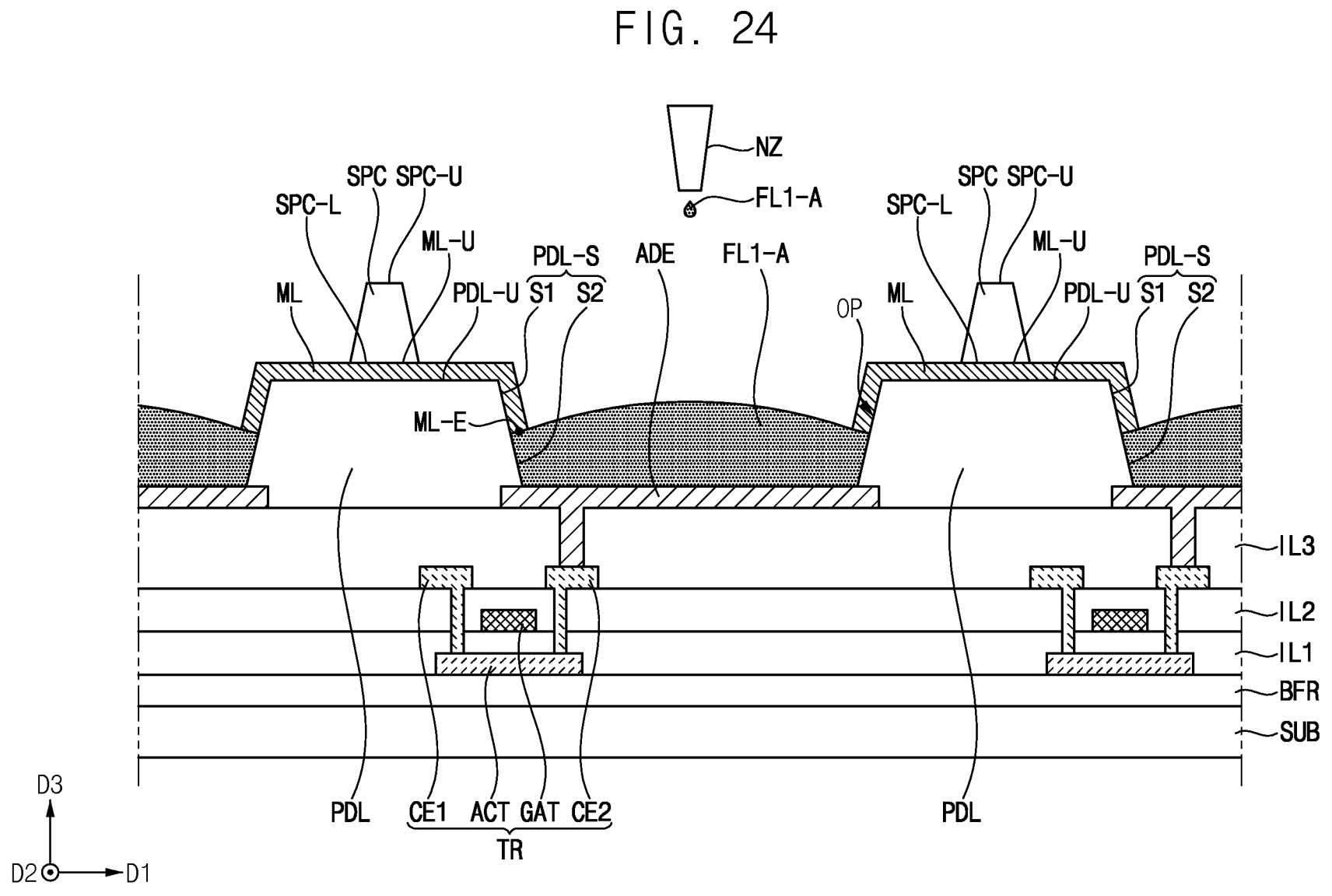
Figure 25:
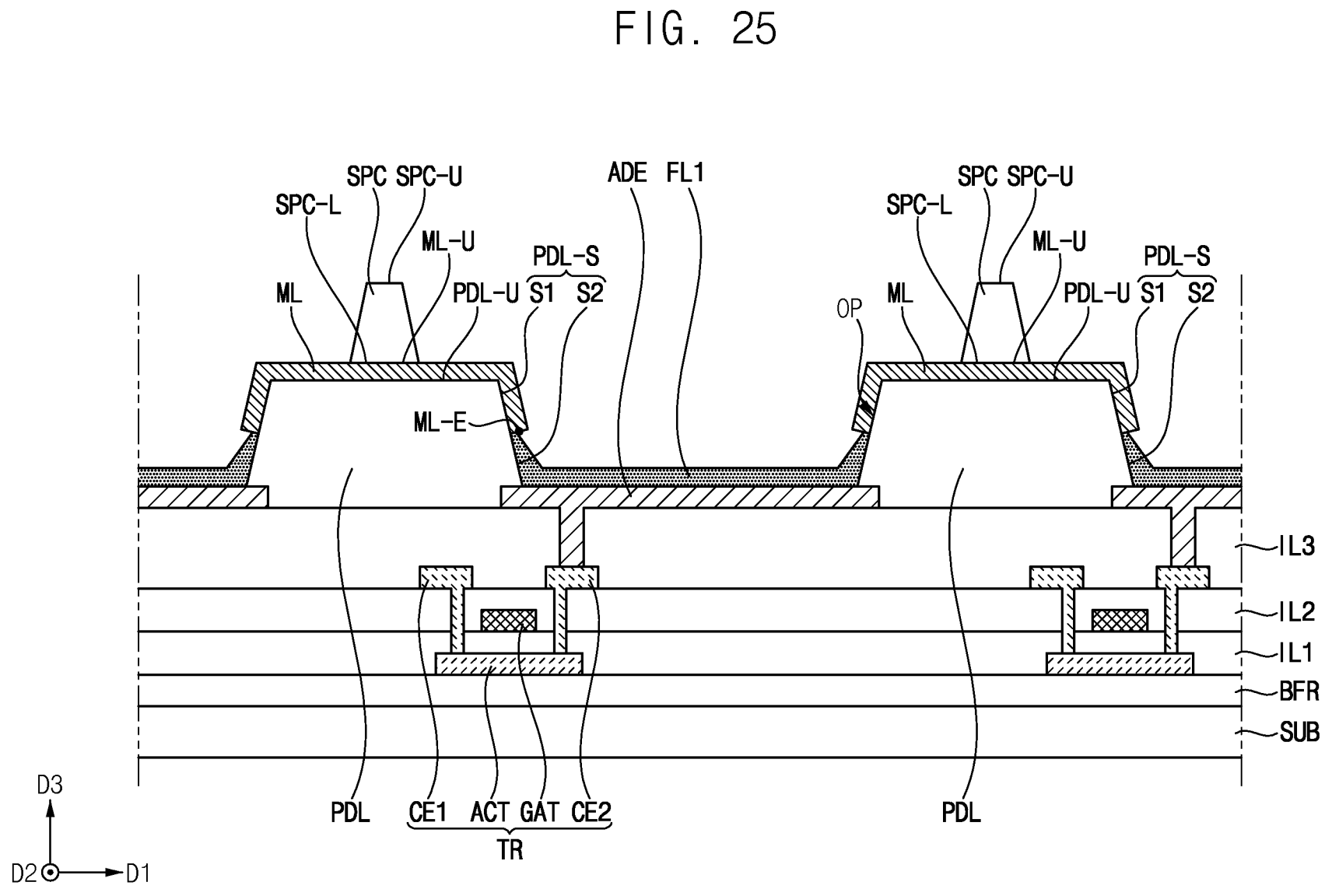

Referring to FIGS. 24 and 25, the first functional layer FL1 may be formed on the pixel electrode ADE. A process of forming the first functional layer FL1 may be substantially the same as the process described above with reference to FIGS. 13 and 14. However, according to the manufacturing method of the display device 20 according to another embodiment, when the composition for forming the preliminary first functional layer FL1-A is provided to the opening OP, the composition for forming the preliminary first functional layer FL1-A may contact the edge ML-E of the metal layer ML. In an embodiment, liquid repellency may be defined not only along the upper surface PDL-U but also along the first surface S1, without being limited thereto. The liquid repellency may substantially terminate corresponding to the edge ML-E, without being limited thereto.

Accordingly, as shown in FIG. 25, the edge of the first functional layer FL1 may contact the edge ML-E of the metal layer ML. In other words, the metal layer ML may be disposed on the first surface S1, and the first functional layer FL1 may be disposed on the second surface S2. Accordingly, a position of the first functional layer FL1 along the side surface PDL-S may be determined by the position of the edge ML-E of the metal layer ML.

Figure 26:
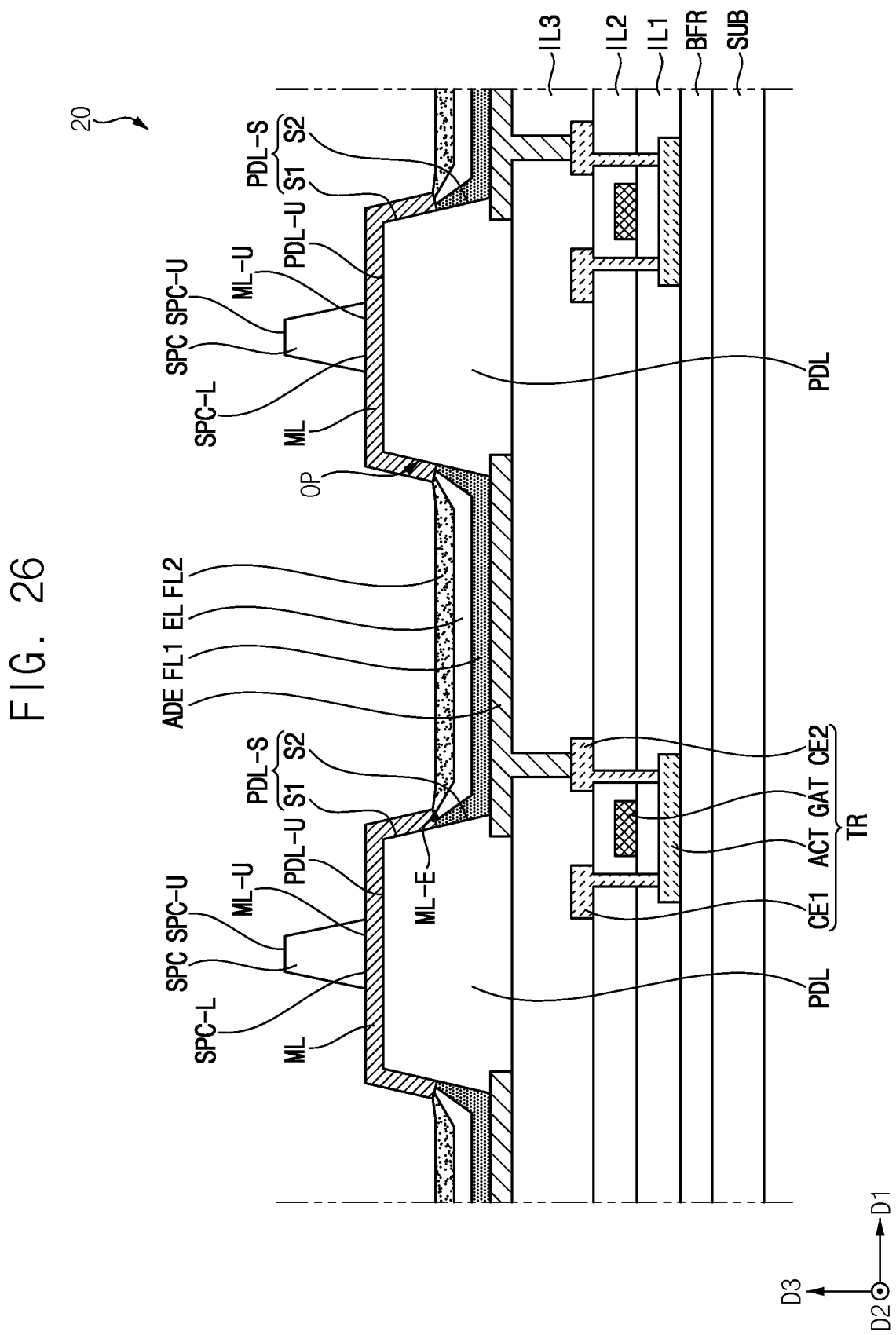

Referring to FIG. 26, the light emitting layer EL may be formed on the first functional layer FL1 and the second functional layer FL2 may be formed on the light emitting layer EL. A process of forming each of the light emitting layer EL and the second functional layer FL2 may be substantially the same as the process of forming the first functional layer FL1 described above with reference to FIG. 25.

For example, each of the light emitting layer EL and the second functional layer FL2 may contact the edge ML-E of the metal layer ML. In other words, the metal layer ML may overlap the first surface S1, and each of the light emitting layer EL and the second functional layer FL2 may overlap the second surface S2. Accordingly, the positions of the light emitting layer EL and the second functional layer FL2 may be determined by the position of the edge ML-E of the metal layer ML.

According to one or more embodiment of the method of providing the display device 20 according to another embodiment, the metal layer ML may be formed to be disposed on the upper surface PDL-U of the pixel defining layer PDL and on a portion of the side surface PDL-S of the pixel defining layer PDL. Therefore, the edge ML-E of the metal layer ML may function as a pinning point in a process of forming each of the first functional layer FL1, the light emitting layer EL, and the second functional layer FL2. Accordingly, defects in the respective processes of forming each of the first functional layer FL1, the light emitting layer EL, and the second functional layer FL2 may be minimized or prevented. Also, each of the first functional layer FL1, the light emitting layer EL, and the second functional layer FL2 may be formed to have constant thickness and/or constant shape. Accordingly, reliability of the stacked structure of the display device 20 may be further improved.

After the first functional layer FL1, the light emitting layer EL, and the second functional layer FL2 are all formed, referring back to FIG. 16, the common electrode CTE may be formed to cover the second functional layer FL2, the pixel defining layer PDL, and the metal layer ML, and the spacer SPC.

In an embodiment, the display device includes a pixel electrode of a light emitting element, a pixel defining layer on the pixel electrode and in which an opening is defined, the opening exposing the pixel electrode to outside the pixel defining layer, a light emitting layer of the light emitting element which is in the opening and on the pixel electrode, a metal pattern which is on the pixel defining layer and spaced apart from the pixel electrode in a direction along the pixel defining layer, and a spacer which is on the metal pattern, the spacer being spaced apart from the pixel defining layer along a thickness direction of the display device, by the metal pattern.

In an embodiment, the metal layer may include a metal material which is oxidizable to define an oxidized portion soluble in water.

In an embodiment, the spacer may include a content of oxygen atoms which is non-uniform along the thickness direction of the display device.

In an embodiment, the spacer may include along the thickness direction, an upper surface furthest from the pixel defining layer, and a lower surface closest to the pixel defining layer, and the content of oxygen atoms adjacent to the upper surface greater than the content of oxygen atoms adjacent to the lower surface.

In an embodiment, the pixel defining layer may include along the thickness direction, an upper surface which is closest to the spacer and has liquid repellency.

In an embodiment, the metal layer may extend further than the spacer in the direction along the pixel defining layer and define a portion of the metal layer which is exposed outside of the spacer. Here, the pixel defining layer may include an upper surface which is closest to the spacer along the thickness direction, and a side surface which extends from the upper surface and defines the opening, and the metal layer may be extended along the upper surface and along the side surface of the pixel defining layer.

In an embodiment, the side surface of the pixel defining layer may include a first surface portion extending from the upper surface, a second surface portion extending from the first surface portion and toward the pixel electrode, and a boundary between the first surface portion and the second surface portion The metal layer which extends along the side surface of the pixel defining layer may include an end corresponding to the boundary between the first surface portion and the second surface portion. Along the side surface of the pixel defining layer, the second surface portion of the pixel defining layer may be exposed outside of the metal layer.

In an embodiment, a method of providing a display device includes providing a pixel electrode of a light emitting element, providing a pixel defining layer which is on the pixel electrode and in which an opening is defined, the opening exposing the pixel electrode to outside the pixel defining layer, providing a preliminary metal layer covering the pixel electrode and the pixel defining layer in which the opening is defined, providing a spacer which on the pixel defining layer and adjacent to the opening, the preliminary layer extending further than the spacer to define an exposed portion of the preliminary metal layer, oxidizing the exposed portion of the preliminary metal layer to define an oxidized portion of the preliminary metal layer which corresponds to the exposed portion, together with defining a non-oxidized portion of the preliminary metal layer which corresponds to the spacer, removing the oxidized portion of the preliminary metal layer to define the non-oxidized portion of the preliminary metal layer as a metal layer of the display device, the metal layer of the display device corresponding to the spacer and being between the pixel defining layer and the spacer, and providing in the opening which is spaced apart from both the spacer and the metal layer, a light emitting layer of the light emitting element.

In embodiments, the removing of the oxidized portion of the preliminary metal layer may include dissolving the oxidized portion with water. The oxidizing of the exposed portion of the preliminary metal layer may include plasma treating using oxygen. The providing of the light emitting layer may include an inkjet printing method.

In an embodiment, the spacer which on the pixel defining layer and adjacent to the opening may include a content of oxygen atoms, and the oxidizing of the exposed portion of the preliminary metal layer may provide the content of oxygen atoms of the spacer which is non-uniform. Here, the spacer may include along a thickness direction of the display device, an upper surface furthest from the pixel defining layer, and a lower surface closest to the pixel defining layer, and the oxidizing of the exposed portion of the preliminary metal layer may define the content of oxygen atoms adjacent to the upper surface to be greater than the content of oxygen atoms adjacent to the lower surface.

In an embodiment, the providing of the spacer may include providing a spacer material layer on the preliminary metal layer, and patterning the spacer material layer using a mask exposure process.

Referring to FIGS. 10 and 11, for example, the oxidizing of the exposed portion of the preliminary metal layer may define an entirety of the metal layer overlapped by the spacer.

Referring to FIGS. 19 to 21, for example, the oxidizing of the exposed portion of the preliminary metal layer may define the non-oxidized portion having a width corresponding to a width of the spacer, and the method may further include after the oxidizing, removing a width portion of the spacer to provide a reduced-width spacer (e.g., the spacer SPC in FIG. 16) of the display device which is on the pixel defining layer and adjacent to the opening. Here, the pixel defining layer may include an upper surface which is closest to the spacer and a side surface which extends from the upper surface and defines the opening, the oxidizing of the exposed portion of the preliminary metal layer may define the non-oxidized portion extending along the upper surface and along the side surface of the pixel defining layer, and the removing of the width portion of the spacer may provide the upper surface of the non-oxidized portion exposed outside of the reduced-width spacer (e.g., the spacer SPC in FIG. 16).

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
   a pixel electrode of a light emitting element;
   a pixel defining layer on the pixel electrode and in which an opening is defined, the opening exposing the pixel electrode to outside the pixel defining layer;
   a light emitting layer of the light emitting element which is in the opening and on the pixel electrode;
   a metal pattern which is on the pixel defining layer and spaced apart from the pixel electrode in a direction along the pixel defining layer; and
   a spacer which is on the metal pattern, the spacer being spaced apart from the pixel defining layer along a thickness direction of the display device, by the metal pattern.

2. The display device of claim 1, wherein the metal pattern includes a metal material which is oxidizable to define an oxidized portion soluble in water.

3. The display device of claim 2, wherein the metal pattern includes molybdenum.

4. The display device of claim 1, wherein the spacer includes a content of oxygen atoms which is non-uniform along the thickness direction of the display device.

5. The display device of claim 4, wherein the spacer includes along the thickness direction:
   an upper surface furthest from the pixel defining layer, and a lower surface closest to the pixel defining layer, and the content of oxygen atoms adjacent to the upper surface greater than the content of oxygen atoms adjacent to the lower surface.

6. The display device of claim 1, wherein the pixel defining layer includes along the thickness direction, an upper surface which is closest to the spacer and has liquid repellency.

7. The display device of claim 1, wherein the pixel defining layer includes along the thickness direction, an upper surface which is closest to the spacer, and the metal pattern covers the upper surface of the pixel defining layer.

8. The display device of claim 1, wherein the metal pattern extends further than the spacer in the direction along the pixel defining layer and defines a portion of the metal pattern which is exposed outside of the spacer.

9. The display device of claim 8, wherein the pixel defining layer includes an upper surface which is closest to the spacer along the thickness direction, and a side surface which extends from the upper surface and defines the opening, and the metal pattern is extended along the upper surface and along the side surface of the pixel defining layer.

10. The display device of claim 9, wherein the side surface of the pixel defining layer includes:

a first surface portion extending from the upper surface, a second surface portion extending from the first surface portion and toward the pixel electrode, and a boundary between the first surface portion and the second surface portion, the metal pattern which extends along the side surface of the pixel defining layer includes an end corresponding to the boundary between the first surface portion and the second surface portion, and along the side surface of the pixel defining layer, the second surface portion of the pixel defining layer is exposed outside of the metal pattern.

11. A method of providing a display device, the method comprising:

providing a pixel electrode of a light emitting element;

providing a pixel defining layer which is on the pixel electrode and in which an opening is defined, the opening exposing the pixel electrode to outside the pixel defining layer;

providing a preliminary metal layer covering the pixel electrode and the pixel defining layer in which the opening is defined;

providing a spacer which on the pixel defining layer and adjacent to the opening, the preliminary layer extending further than the spacer to define an exposed portion of the preliminary metal layer;

oxidizing the exposed portion of the preliminary metal layer to define an oxidized portion of the preliminary metal layer which corresponds to the exposed portion, together with defining a non-oxidized portion of the preliminary metal layer which corresponds to the spacer;

removing the oxidized portion of the preliminary metal layer to define the non-oxidized portion of the preliminary metal layer as a metal pattern of the display device, the metal pattern of the display device corresponding to the spacer and being between the pixel defining layer and the spacer; and providing in the opening which is spaced apart from both the spacer and the metal pattern, a light emitting layer of the light emitting element.

12. The method of claim 11, wherein the removing of the oxidized portion of the preliminary metal layer includes dissolving the oxidized portion with water.

13. The method of claim 11, wherein the oxidizing of the exposed portion of the preliminary metal layer includes plasma treating using oxygen.

14. The method of claim 11, wherein the spacer which on the pixel defining layer and adjacent to the opening includes a content of oxygen atoms, and the oxidizing of the exposed portion of the preliminary metal layer provides the content of oxygen atoms of the spacer which is non-uniform.

15. The method of claim 14, wherein the spacer includes along a thickness direction of the display device, an upper surface furthest from the pixel defining layer, and a lower surface closest to the pixel defining layer, and the oxidizing of the exposed portion of the preliminary metal layer defines the content of oxygen atoms adjacent to the upper surface to be greater than the content of oxygen atoms adjacent to the lower surface.

16. The method of claim 11, wherein the providing of the light emitting layer includes an inkjet printing method.

17. The method of claim 11, wherein the providing of the spacer includes:

providing a spacer material layer on the preliminary metal layer, and patterning the spacer material layer using a mask exposure process.

18. The method of claim 17, wherein the oxidizing of the exposed portion of the preliminary metal layer defines an entirety of the metal pattern overlapped by the spacer.

19. The method of claim 17, wherein the oxidizing of the exposed portion of the preliminary metal layer defines the non-oxidized portion having a width corresponding to a width of the spacer, the method further comprising after the oxidizing, removing a width portion of the spacer to provide a reduced-width spacer of the display device which is on the pixel defining layer and adjacent to the opening.

20. The method of claim 19, wherein the pixel defining layer includes an upper surface which is closest to the spacer and a side surface which extends from the upper surface and defines the opening, the oxidizing of the exposed portion of the preliminary metal layer defines the non-oxidized portion extending along the upper surface and along the side surface of the pixel defining layer, and the removing of the width portion of the spacer provides the upper surface of the non-oxidized portion exposed outside of the reduced-width spacer.

* * * * *